(12) United States Patent
Amagai et al.

(10) Patent No.: US 7,388,057 B2
(45) Date of Patent: Jun. 17, 2008

(54) DI(METH)ACRYLATE OF EPOXY-TERMINATED POLYPHENYLENE ETHER

(75) Inventors: Akikazu Amagai, Tokyo (JP); Kenzi Ishii, Tokyo (JP); Kiyonari Hiramatsu, Tokyo (JP); Makoto Miyamoto, Tokyo (JP); Daisuke Ohno, Tokyo (JP); Katsutoshi Yamazaki, Tokyo (JP); Yasumasa Norisue, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 11/812,892

(22) Filed: Jun. 22, 2007

(65) Prior Publication Data

US 2007/0265423 A1  Nov. 15, 2007

Related U.S. Application Data

(62) Division of application No. 11/110,917, filed on Apr. 21, 2005, now Pat. No. 7,247,682, which is a division of application No. 10/851,290, filed on May 24, 2004, now Pat. No. 6,962,744, which is a division of application No. 10/180,507, filed on Jun. 27, 2002, now Pat. No. 6,794,481.

(30) Foreign Application Priority Data

| Jun. 28, 2001 | (JP) | 2001-196569 |
|---|---|---|
| Nov. 19, 2001 | (JP) | 2001-353194 |
| Dec. 20, 2001 | (JP) | 2001-387968 |
| Jan. 15, 2002 | (JP) | 2002-6211 |
| Feb. 15, 2002 | (JP) | 2002-38432 |
| Feb. 28, 2002 | (JP) | 2002-53653 |
| Mar. 11, 2002 | (JP) | 2002-65735 |

(51) Int. Cl.
- *C08G 65/44* (2006.01)
- *C08G 65/48* (2006.01)
- *C08L 71/12* (2006.01)

(52) U.S. Cl. .................. 525/391; 525/390; 525/396
(58) Field of Classification Search .............. None
See application file for complete search history.

(56) References Cited

U.S. PATENT DOCUMENTS

| 4,448,948 A | * | 5/1984 | Tsubaki et al. ............. 528/95 |
| 4,460,743 A | * | 7/1984 | Abe et al. ................. 525/68 |
| 5,270,435 A | | 12/1993 | Pfaendner et al. |
| 6,689,920 B2 | | 2/2004 | Ishii et al. |

FOREIGN PATENT DOCUMENTS

| EP | 921158 A2 | 6/1999 |
| JP | 62-41223 A * | 2/1987 |

* cited by examiner

*Primary Examiner*—Robert Sellers
(74) *Attorney, Agent, or Firm*—Wenderoth, Lind & Ponack, L.L.P.

(57) ABSTRACT

A bifunctional phenylene ether oligomer containing monophenylene and biphenylene moieties can be rendered thermosetting by reacting the terminal phenolic hydroxyl groups with a) a cyanogen halide to introduce terminal cyanate groups, b) a halogenated glycidyl to form terminal epoxy groups, or c) an allyl halide to produce allylic terminal groups. The epoxy-terminated phenylene ether oligomer can be further reacted acrylic and/or methacrylic acid to yield an epoxy di(meth)acrylate which can be further modified with a carboxylic acid or anhydride to obtain and acid-modified epoxy di(meth)acrylate.

2 Claims, 3 Drawing Sheets

DI(METH)ACRYLATE OF EPOXY-TERMINATED POLYPHENYLENE ETHER

This is a divisional of Ser. No. 11/110,917, filed Apr. 21, 2005 now U.S. Pat. No. 7,247,682, which is a divisional of Ser. No. 10/851,290, filed May 24, 2004, now U.S. Pat No. 6,962,744, which is a divisional of Ser. No. 10/180,507, filed Jun. 27, 2002, now U.S. Pat. No. 6,794,481.

FIELD OF THE INVENTION

The present invention relates to a bifunctional phenylene ether oligomer (to be sometimes referred to as "PEO" hereinafter). More specifically, it relates to a curable resin composition having a phenolic hydroxyl group, a thermosetting functional group or the like at each terminal, its cured product, its use and a process for the production thereof. According to the present invention, there are produced a thermosetting resin or a photocurable resin and its intermediate product each of which is suitable for use in electronics fields requiring a low dielectric constant, a low dielectric loss tangent and high toughness and also suitable for various uses such as coating, bonding and molding.

BACKGROUND OF THE INVENTION

As for materials for use in an electric or electronic field, as the speed of transmission signal increases, a low dielectric constant which decreases a time delay and a low dielectric loss tangent which decreases a loss are desired for utilizing a high-frequency wave (gigahertz band). Further, higher toughness is also desired in order to inhibit the occurrence of microcracks thought to be generated by thermal shock and secure high reliability.

For the above demands, the use of engineering plastic such as polyphenylene ether (PPE) is proposed. PPE has excellent high frequency properties. On the other hand, known problems of PPE are that it is poor in compatibility with a thermosetting resin such as an epoxy resin or a cyanate resin, that it has a high melt viscosity so that molding processability is poor, and that a solvent in which it is soluble is limited to an aromatic hydrocarbons solvent such as toluene, benzene or xylene and an halogenated hydrocarbon solvent such as methylene chloride or chloroform so that workability is poor.

For improving compatibility, a method of improving compatibility by blending PPE with a different resin as a compatibilizing agent is discussed and the pseudo IPN structuralization of a cyanate resin is also discussed (JP-A-11-21452, etc.). However, the problems of molding processability and heat resistance have not been solved yet. Further, a method of converting a high molecular PPE into a low molecular compound is discussed for improving moldability. For example, there are known a method in which a high molecular PPE and a bivalent phenol are redistributed in the presence of a radical catalyst (JP-A-9-291148, etc.) and a method in which a bivalent phenol and a monovalent phenol are subjected to oxidation polymerization (JP-B-8-011747). In each of the above methods, a high molecular substance is presence so that it is impossible to obtain a bifunctional low molecular oligomer effectively.

Further, an epoxy acrylate compound has been widely used as raw materials for various functional high molecular materials such as a photosensitive material, an optical material, a dental material, an electronic material and crosslinking agents for various polymers. However, since higher performances are being required in these application fields in recent years, physical properties required as a functional high molecular material become severer increasingly. As such physical properties, for example, heat resistance, weather resistance, low water absorptivity, high refractive index, high fracture toughness, low dielectric constant and low dielectric loss tangent are required. Until now, these required physical properties have not been necessarily satisfied. For example, concerning the production of a printed wiring board, it is known that an epoxy acrylate compound is used for a photo solder resist used as a permanent mask. As a resist material like above, there are known a novolak type epoxy acrylate compound disclosed in JP-A-61-243869, a bisphenol fluorene type epoxy acrylate compound disclosed in JP-A-3-205417 and acid-modified products of these epoxy acrylate compounds. In a use for a printed wiring board, heat resistance in an immersion in a solder bath is demanded. When the heat resistance is insufficient, swelling or peeling off of a resist film occurs, which causes defectives. In compliance with an increase in the speed of transmission signal, recently, in addition to the above-mentioned heat resistance, a lower dielectric constant which decreases a time delay and a lower dielectric loss tangent which decreases a loss are desired for utilizing a high-frequency wave (gigahertz band). However, a conventional epoxy acrylate compound is insufficient in dielectric characteristic corresponding to a high-frequency wave. For this reason, a novel epoxy acrylate compound which satisfies the above requirements is demanded.

On the other hand, as a thermosetting resin, there are known a polyphenylene ether modified epoxy resin, a thermosetting type polyphenylene ether and the like. A conventional thermosetting resin has problems with regard to workability, moldability, heat resistance or the like. That is, problems are that, when a varnish is prepared by using the conventional thermosetting resin, a solvent is limited, and that due to a high melt viscosity, a high multilayer formation can not be carried out and a high temperature and a high pressure are required at a molding time. Further, a cyanate ester resin is known as a thermosetting resin having excellent dielectric characteristic and excellent moldability. However, when a cyanate ester resin alone is used, a cured product is too hard and is fragile so that it has a problem with regard to adhesive property and solder resistance. When a cyanate ester resin is used in combination with an epoxy resin, the above defects can be covered to some extent. However, it is difficult to cope with requirements of lower dielectric characteristics for laminates, which requirements are becoming severer, by using a conventional cyanate ester resin in combination with a conventional epoxy resin. Further, the coexistence of lower dielectric characteristics and flexibility is difficult.

Concerning a semiconductor device, an epoxy resin composition is generally used for sealing electronic parts such as a semiconductor. The above-mentioned epoxy resin composition is composed of various epoxy resins such as a cresol novolak type epoxy resin, a bisphenol A type epoxy resin and a biphenyl type epoxy resin, a curing agent therefor, an inorganic filler, a curing accelerator as required, a coupling agent, a releasing agent, a coloring agent and the like.

In compliance with recent requirements for a decrease in size or a decrease in thickness, the formation technique of the above electronic parts is being changed from a conventional through hole mounting method (DIP: dual inline package, etc.) to a surface mounting method (SOP: small outline package, QFP: quad flat package, etc.). In the surface mounting method, since a semiconductor device is treated at a high temperature (for example 210° C.~260° C.) at a solder reflow or the like at a mounting time, a high temperature heat is applied to the entire semiconductor device. In this case, problems such as the occurrence of cracks in a sealing layer formed of the above epoxy resin composition and a large decrease in humidity resistance are apt to occur. For example, when a thin sealing layer having a thickness of 2.0 mm or less is used, cracks are apt to occur at the time of a solder reflow. In view of a further improvement in physical properties and an increase in a signal transmission speed in a chip circuit, it is demanded to carry out a sealing with a sealing layer having a lower dielectric constant.

Countermeasures against the above are proposed. One countermeasure with respect to handling is that a semiconductor device before mounting is packaged in a moisture-proof case. As an improvement in a sealing epoxy resin composition, for example, JP-A-1-108256 discloses a sealing material containing a biphenyl type epoxy resin and JP-A-64-24825 discloses a sealing material containing an epoxy resin and a polyphenylene ether type resin in combination.

Further, a (meth)acrylate compound have been widely used as raw materials for various functional high molecular materials such as a photosensitive material, an optical material, a dental material, an electronic material and crosslinking agents for various polymers. However, since higher performances are being required in these application fields in recent years, physical properties required as a functional high molecular material become severer increasingly. As such physical properties, for example, heat resistance, weather resistance, low absorptivity, high refractive index, high fracture toughness, low dielectric constant and low dielectric loss tangent are required. Until now, these required physical properties have not been necessarily satisfied.

SUMMARY OF THE INVENTION

It is an object of the present invention to provide a bifunctional phenylene ether oligomer which is a resin having the excellent electric characteristics and toughness of PPE and improved in compatibility with a different resin and moldability and which is soluble in a general-purpose ketone solvent and has a PPE structure whose terminal phenolic hydroxyl groups are easy to modify, and a thermosetting resin obtained from the above oligomer.

It is another object of the present invention to provide a novel epoxy acrylate compound and a curable resin composition which have excellent heat resistance and have a low dielectric constant and a low dielectric loss tangent.

It is further another object of the present invention to provide, in a printed wiring board material field, a thermosetting resin composition excellent in dielectric characteristic and also excellent in molability, heat resistance, etc., a laminate obtained by using the thermosetting resin composition and a printed wiring board obtained by the thermosetting resin composition.

It is still another object of the present invention to provide a sealing epoxy resin composition capable of giving a sealing layer which is free from the occurrence of cracks when it is exposed to a high temperature, such as a temperature in a solder reflow, and has a low dielectric constant.

It is still further another object of the present invention to provide, in a printed wiring board material field, a thermosetting resin composition which copes with the severe requirement of low dielectric characteristics and has flexibility, a laminate obtained by using the above thermosetting resin composition and a printed wiring board obtained by using the above thermosetting resin composition.

It is furthermore another object of the present invention to provide a novel (meth)acrylate compound and a curable resin composition which have excellent heat resistance and have a low dielectric constant and a low dielectric loss tangent.

According to the present invention 1, there is provided a bifunctional phenylene ether oligomer of the formula (1), obtained by oxidation polymerization of a bivalent phenol of the formula (2) and a monovalent phenol of the formula (3),

(1)

(2)

(3)

(wherein —X— is represented by the formula (2'),

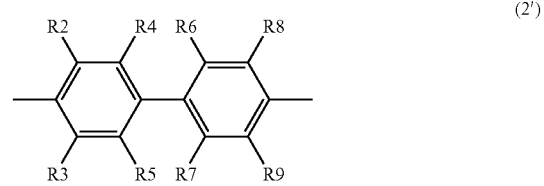

(2')

in which R2, R3, R4, R8 and R9 may be the same or different and are a halogen atom, an alkyl group having 6 or less carbon atoms or a phenyl group, R5, R6 and R7 may be the same or different and are a hydrogen atom, a halogen atom, an alkyl group having 6 or less carbon atoms or a phenyl group, Y—O— is represented by the formula (3),

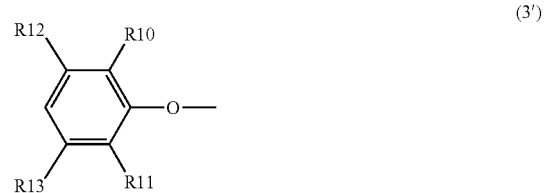

(3')

in which R10 and R11 may be the same or different and are a halogen atom or an alkyl group having 6 or less carbon atoms or a phenyl group, R12 and R13 may be the same or different and are a hydrogen atom, a halogen atom, an alkyl group having 6 or less carbon atoms or a phenyl group, provided that Y—O— is an arrangement of one kind of structure defined by the formula (3') or a random arrangement of at least two kinds of structures defined by the formula (3'), and each of a and b is an integer of 0 to 300, preferably 0 to 100, more preferably 0 to 50, provided that at least either a or b is not 0), R2, R3, R4, R8, R9, R10 and R11 in the formula (2) and the formula (3) being required not to be a hydrogen atom.

According to the present invention 2, further, there is provided a thermosetting resin represented by the formula (4),

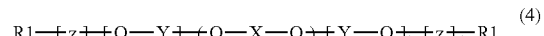

(4)

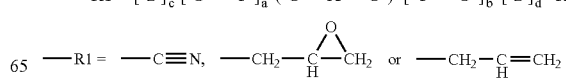

wherein —X—, Y—O—, a and b are as defined in the formula (1), Z is an organic group having one or more carbon atoms and may contain an oxygen atom, and each of c and d is an integer of 0 or 1.

According to the present invention 2, further, there is provided a thermosetting resin, as a preferable thermosetting resin, according to the above, wherein —X— in the above formula is represented by the formula (5) and Y—O— has an arrangement structure of the formula (6) or the formula (7) or a random arrangement structure of the formula (6) and the formula (7).

According to the present invention 3, further, there are provided an acid-modified epoxy acrylate compound of the above epoxy acrylate compound, a curable resin composition containing these, and a cured product obtained by curing the above composition.

According to the present invention 4, further, there is provided an epoxy resin composition for laminates, comprising a curing agent and a phenylene ether oligomer compound having a number average molecular weight of 700 to 3,000 and having an epoxy group at each terminal, represented by the formula (9),

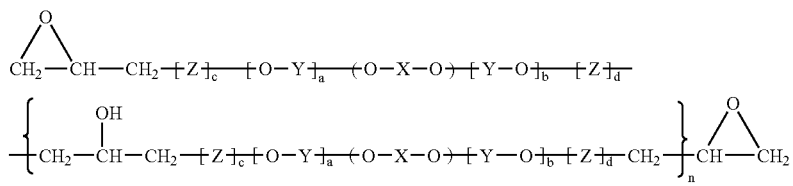

(9)

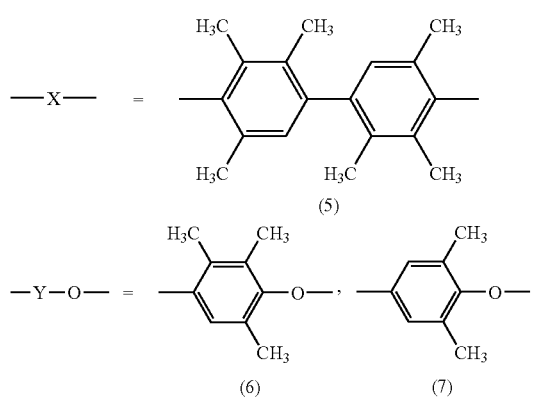

According to the present invention 3, further, there is provided an epoxyacrylate compound represented by the formula (8), wherein —X—, Y—O—, a and b are as defined in the formula (1), Z, c and d are as defined in the formula (4), and n is an integer of 0 to 10.

According to the present invention 4, further, there is provided a resin composition for laminates, wherein the above resin composition further contains a cyanate resin.

According to the present invention 4, further, there is provided prepreg, a laminate, or a printed wiring board obtained by using the above epoxy resin composition for laminates.

According to the present invention 5, further, there is provided a sealing epoxy resin composition containing the epoxy resin composition recited above and further containing as ingredients an epoxy resin and an inorganic filler.

According to the present invention 6, further, there is provided a resin composition for laminates, containing as an ingredient a phenylene ether oligomer cyanate compound having a number average molecular weight of 700 to 3,000

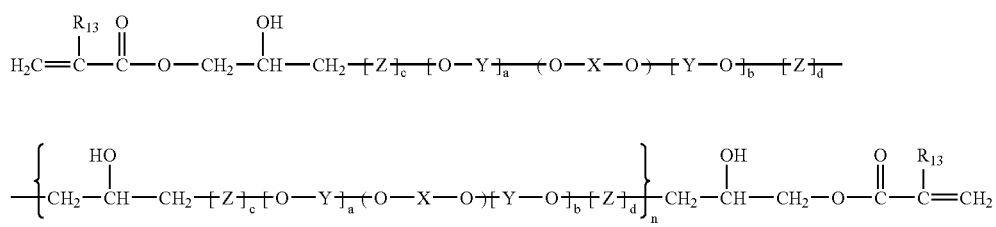

(8)

wherein R13 is a hydrogen atom or a methyl group, —X—, Y—O—, a and b are as defined in the formula (1), Z, c and d are as defined in the formula (4) and n is an integer of 0 to 10.

According to the present invention 3, further, there is provided an epoxy acrylate compound according to the above, wherein —X is represented by the formula (5) recited above, and Y—O— has an arrangement structure of the formula (6) recited above or the formula (7) recited above or a random arrangement structure of the formula (6) and the formula (7).

and having a cyanate group at each terminal, represented by the formula (10), (10)

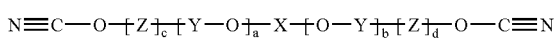

wherein —X—, Y—O—, a and b are as defined in the formula (1) and Z, c and d are as defined in the formula (4).

According to the present invention 6, further, there is provided a resin composition for laminates according to the above, which contains the cyanate compound of the formula (10) and further contains a different cyanate ester resin and an epoxy resin.

According to the present invention 7, further, there is provided a (meth)acrylate compound represented by the formula (11),

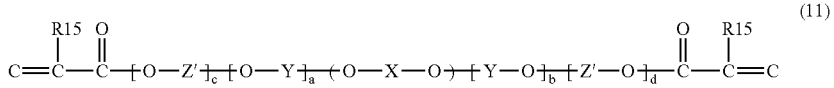

(11)

wherein X—, Y—O—, a and b are as defined in the formula (1), Z' is an organic group which have no OH group in a side chain and has one or more carbon atoms and which may contain an oxygen atom, c and d are as defined in the formula (4), and R15 is a hydrogen atom or a methyl group.

According to the present invention 7, further, there is provided a curable resin composition containing the above (meth)acrylate compound.

DETAILED DESCRIPTION OF THE INVENTION

The present inventors have made diligent studies concerning a bifunctional phenylene ether and found that a bifunctional phenylene ether of the formula (1) is effectively produced by oxidation polymerization of a bivalent phenol (HO—X—OH) of the formula (2) and a monovalent phenol (Y—OH) of the formula (3) in a ketone solvent. On the basis of the above finding, the present invention has been completed. The present invention will be explained in detail hereinafter.

The bivalent phenol of the present invention refers to a bivalent phenol which has a stiff biphenyl structure, —X—, expressed by the formula (2') in which R2, R3, R4, R8 and R9 may be the same or different and are a halogen atom, an alkyl having 6 or less carbon atoms or a phenyl group, R5, R6 and R7 may be the same or different and are a hydrogen atom, a halogen atom, an alkyl group having 6 or less carbon atoms or a phenyl group, and each of R2, R3, R4, R8 and R9 is required not to be a hydrogen atom. The formula (2) which is represented by HO—X—OH is shown below.

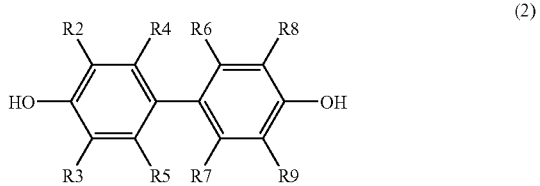

(2)

In the formula (2), 2,3,3',5,5'-pentamethyl-[1,1'-biphenyl]-4,4'-diol and 2,2',3,3',5,5'-hexamethyl-[1,1'-biphenyl]-4,4'-diol are particularly preferred. When a bivalent phenol having no substituent at 2-site (R4 in the formula (2)) is used as a raw material, the oxidation rate of the bivalent phenol itself is very high so that the bivalent phenol is converted into diphenoquinone and is precipitated from a reaction solution.

Figure 1:
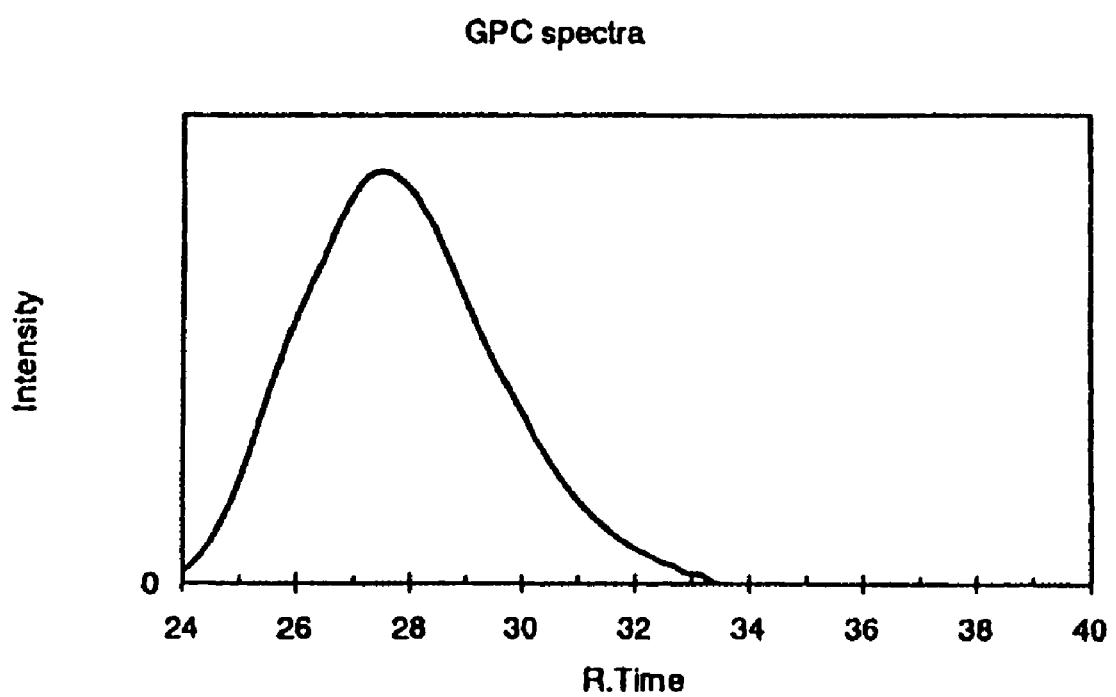
FIG. 1 shows a GPC spectrum of a product in Comparative Example 1.
Figure 2:
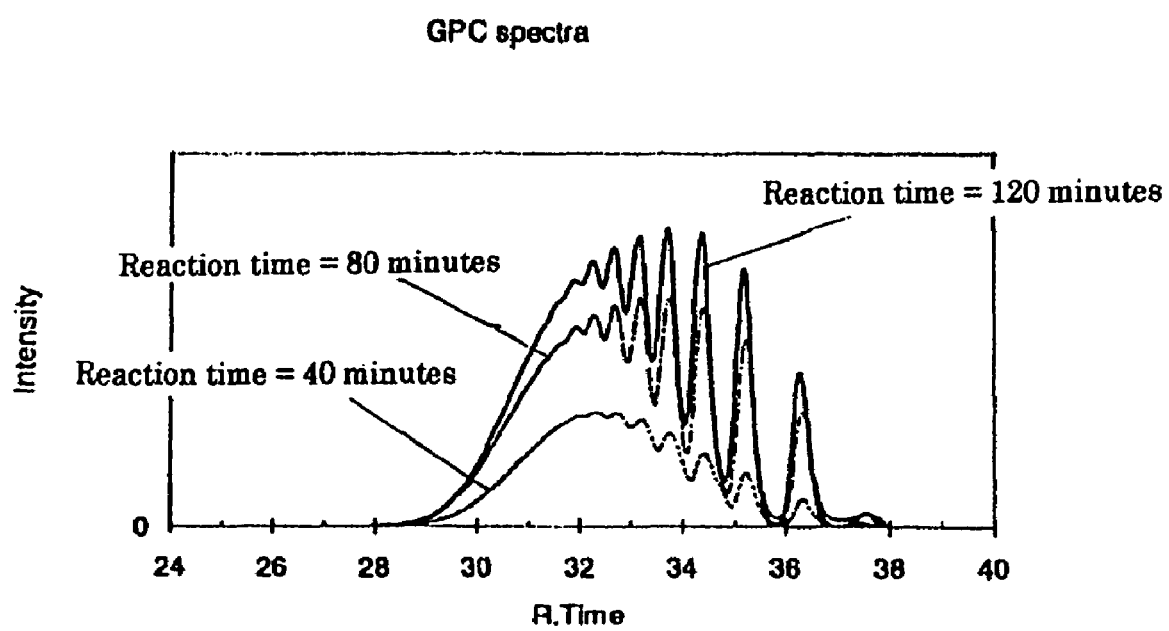
FIG. 2 shows a GPC spectrum of a product in Example 2.
Figure 3:
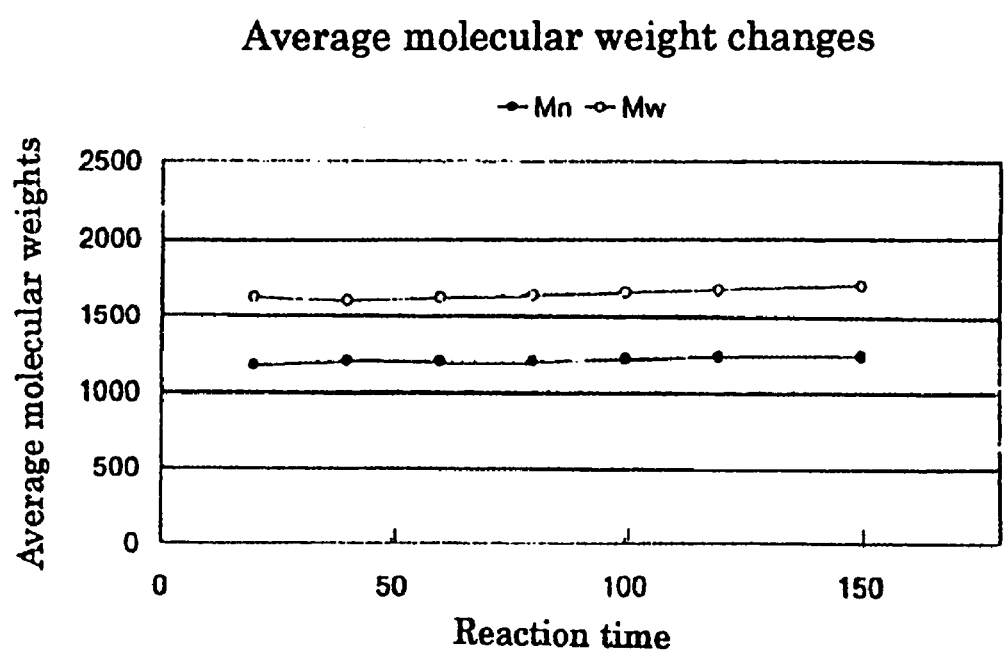
FIG. 3 shows GPC spectrum changes over the passage of reaction time in Example 2.

As a result thereof, the homopolymerization of monovalent phenol of the formula (3) preferentially proceeds. The growth of a phenylene ether having a phenolic hydroxyl group only at one terminal proceeds till the precipitation from a reaction solution. Therefore, a bifunctional phenylene ether soluble in methyl ethyl ketone cannot be efficiently synthesized. For example, as a bifunctional phenol which does not have a substituent at a 2-site, there is 3,3',5,5'-tetramethyl-[1,1'-biphenyl]-4,4'-diol. When this phenol is used for synthesis, the GPC spectrum of a precipitate is shown as in FIG. 1. The generation of a polymer can be confirmed. On the other hand, there is 2,2'3,3'5,5'-hexamethyl-[1,1'-biphenyl]-4,4'-diol as a bivalent phenol having a substituent at a 2-site (R2 in the formula (2')). According to GPC spectrum variations (FIG. 2) and average molecular weight changes (FIG. 3) in a reaction where the above phenol is used, the molecular weight distribution of an obtained bifunctional phenylene ether is almost the same between the initiation of the reaction and the termination thereof and no generation of a polymer is confirmed. Therefore, an intended bifunctional phenylene ether oligomer can be effectively obtained.

As described above, when a bivalent phenol having substituents at 2-, 3- and 5-sites is used, there is obtained a product having a molecular weight distribution which is not expected from a conventional raw material having substituents at 3- and 5-sites. Therefore, for solving the objects of the present invention, it is required to lower the oxidation rate of bivalent phenol itself, and the existence of a substituent at a 2-site (R2 in the formula (2) is indispensable.

The monovalent phenol of the present invention refers to a monovalent phenol represented by the formula (3) expressed by Y—O—H.

(3)

In the formula (3), R10 and R11 may be the same or different and are a halogen atom, an alkyl group having 6 or less carbon atoms or a phenyl group, R12 and R13 may be the same or different and are a hydrogen atom, a halogen atom, an alkyl group having 6 or less carbon atoms or a phenyl group. In particular, it is preferred that a monovalent phenol having substituents at the 2- and 6-sites is used alone or used in combination with a monovalent phenol having a substituent(s) at the 3-site or at the 3- and 5-sites in addition to the 2- and 6-sites. More preferably, when used alone, 2,6,-dimethylphenol is preferred, and when used in combination, 2,6,-dimethylphenol and 2,3,6-trimethylphenol are preferred. The ratio of the monovalent phenol having a substituent at the 3-site or substituents at the 3- and 5-sites in all the monovalent phenols, when used in combination, is preferably 70% by mole or less. When the ratio of the monovalent phenol having substituent(s) at the 3-site or at the 3- and 5-sites in all the monovalent phenols is more than 70% by mole, the above monovalent phenol is converted into a crystalline compound so that, even when the compound has a number average molecular weight of approximately 1,000, it is insoluble in methyl ethyl ketone. Further, a lower molecular oligomer is obtained when 2,6-dimethylphenol is used in combination with 2,3,6-trimethylphenol as compared with the case where 2,6-dimethylphenol alone is used. The reason is that the methyl group at the 3-site of 2,3,6-trimethylphenol retards polymerization and therefore retards the generation of a polymer.

Then, the production process of the present invention 1 will be explained. The bifunctional phenylene ether oligomer of the present invention 1 represented by the formula (1) is obtained by oxidation polymerization of the bivalent phenol of the formula (2) and the monovalent phenol of the formula (3). The oxidation method includes a method in which an oxygen gas or air is directly used. There is also an electrode-oxidation method. Any methods may be used, and the oxidation method is not specially limited. In view of safety and low-cost investment in plant and equipment, air oxidation is preferred. When the oxidation is carried out with air, there is generally selected a pressure of from atmospheric pressure to 20 kg/cm$^2$.

A catalyst used when the oxidation polymerization is carried out by the use of an oxygen gas or air, includes copper salts such as CuCl, CuBr, $Cu_2SO_4$, $CuCl_2$, $CuBr_2$, $CuSO_4$ and CuI. These may be used alone or in combination. These catalysts may be used in combination with one amine or two or more amines. The amine includes mono- and dimethylamines, mono- and diethylamines, mono- and dipropylamines, mono- and di-n-butylamines, mono- and sec-dipropylamines, mono- and dibenzylamines, mono- and dicyclohexylamines, mono- and diethanolamines, ethylmethylamine, methylpropylamine, allylethylamine, methylcyclohexylamine, morpholine, methyl-n-butylamine, ethylisopropylamine, benzyl methyl amine, octylbenzylamine, octylchlorobenzylamine, methyl(phenylethyl)amine, benzylethylamine, di(chlorophenylethyl)amine, 1-methylamino-4-pentene, pyridine, methylpyridine, 4-dimethylaminopyridine and piperidine. The catalysts shall not be limited to these examples, and any other copper salts and amines may be used. In particular, as an amine, di-n-butylamine is preferred. The use of di-n-butylamine retards the homopolymerization of the monovalent phenol of the formula (3) so that a polymer is hard to generate. Therefore, there is obtained a bifunctional phenylene ether oligomer having a sharp molecular weight distribution.

Next, the solvent used in the present invention 1 will be explained. A ketone solvent and an alcohol solvent have been thought to be a poor solvent in oxidation polymerization and used only in a limited ratio in a conventional oxidation polymerization of PPE, while these solvents may be used in the present invention. Conventionally, this kind of reaction generates a polymer which is hard to solve in an organic solvent. Therefore, it has been impossible to increase the ratio of ketone or alcohol used as a reaction solvent. However, the generation product of the present invention 1 is only a low molecular weight oligomer, as shown in the above chart (FIG. 2), so that it is easily dissolved in ketone or alcohol. Accordingly, the range of a usable solvent has broadened greatly.

Each of the ketone solvent and the alcohol solvent may be used alone or in combination with an aromatic hydrocarbon solvent such as toluene, benzene or xylene or a halogenated hydrocarbon solvent such as methylene chloride, chloroform or carbon tetrachloride, each of which is a conventional solvent. The ketone solvent includes acetone, methyl ethyl ketone, diethyl ketone, methyl butyl ketone and methyl isobutyl ketone. The alcohol solvent includes methanol, ethanol, butanol, propanol, methyl propylene diglycol, diethylene glycol ethyl ether, butyl propylene glycol and propyl propylene glycol. The ketone solvent and the alcohol solvent shall not be limited to these. The object of the present invention 1 is the generation of an oligomer having a relatively low molecular weight and a sharp peak in a molecular weight distribution, and the effect thereof is noticeably produced when the ketone solvent is used. Further, in view of the solubility of the bivalent phenol as a raw material, the solvent is most preferably methyl ethyl ketone alone or a mixed solvent containing methyl ethyl ketone.

The reaction temperature in the production process of the present invention 1 is not specially limited, unless it enters the explosion limit range of a solvent used. It is preferably 25 to 50° C. Since oxidation polymerization is an exothermic reaction, the control of a temperature is difficult and it is hard to control a molecular weight when the reaction temperature is more than 50° C. When the reaction temperature is lower than 25° C., it enters the explosion limit range so that safety production can not be carried out.

The phenol concentrations in the production process of the present invention 1 will be explained. The concentration of the bivalent phenol of the formula (2) is preferably 2 to 20% by weight based on the solvent to be dropwise added. When it exceeds 20% by weight, the bivalent phenol is not completely dissolved in the solvent in some cases. On the other hand, when the above concentration is less than 2% by weight, the reaction rate of the polymerization decreases. Further, the concentration of the monovalent phenol of the formula (3) is preferably 6 to 50% by weight based on the solvent. When the concentration exceeds 50% by weight, the monovalent phenol is not completely dissolved in the solvent in some cases. On the other hand, when the above concentration of the monovalent phenol is less than 6% by weight, the reaction rate of the polymerization decreases.

The molar ratio between the bivalent phenol of the formula (2) and the monovalent phenol of the formula (3) in the production process of the present invention 1 is preferably in the range of from 1:1 to 1:10. Particularly preferably, the above molar ratio is from 1:2 to 1:8. Since the homopolymerization of the monovalent phenol is not easily caused in the above range, it is possible to control a molecular weight. When the ratio between the bivalent phenol of the formula (2) and the monovalent phenol of the formula (3) is smaller than 1:2, remains of the bivalent phenol of the formula (2) increase. Further, the above ratio is larger than 1:10, the homopolymerization of the monovalent phenol of the formula (3) occurs so that a molecular weight becomes too large and an obtained oligomer is insoluble in methyl ethyl ketone.

An equipment for the production and the production process, used in the present invention 1, will be explained. A copper catalyst, an amine and a solvent are placed in a longitudinally long reactor equipped with a stirrer, a thermometer, an air-introducing tube and a baffleplate. These materials are stirred at 40° C. and a mixed solution obtained by dissolving the bivalent phenol and the monovalent phenol in a solvent is dropwise added to the reactor with carrying out air-bubbling. The dropwise addition time is preferably in the range of from 50 minutes to 210 minutes. When the dropwise addition time is not in the above range, the variance of molecular weight distribution of an obtained oligomer is large. Further, after the completion of the dropwise addition, it is preferred to carry out stirring for 5 minutes to 5 hours. Even when the stirring is carried out for more than 5 hours, a further increase in a molecular weight does not happen so that the reaction should be terminated.

Next, the present invention 2 will be explained.

As shown in the present invention 1, the present inventors have synthesized the bifunctional phenylene ether oligomer succeeding the excellent electric characteristics and toughness of PPE (Japanese Patent Application No. 2001-196569). For further converting the above bifunctional phenylene ether oligomer into a thermosetting resin composition having high activity, the present inventors have made diligent studies and as a result found that a thermosetting resin composition of the formula (4) improved in compatibility with a different resin and in molding processability can be obtained by changing terminals of the bifunctional phenylene ether oligomer, in which —X— is represented by the formula (2') and Y—O— is an arrangement of one kind of structure defined by the formula (3') or a random arrangement of at least two kinds of structures defined by the formula (3'), to thermosetting functional groups. On the basis of the above finding, the present inventors have completed the present invention 2. The present invention will be explained in detail hereinafter.

The present invention is characterized in that, in an oxidative coupling or an oxidation polymerization of phenols, the oxidation rates of the phenols themselves are lowered to effectively produce a novel phenolic resin. The present invention is completed by using as a raw material a compound having a substituent introduced at 3-site in addition to substituents at 2- and 6-sites which have been thought to be necessary in an oxidation polymerization reaction. Examples of the effects thereof are as follows. Concerning an oxidative coupling of 2,6-dimethylphenol, there is a study (JP-A-60-152433) in which the pH of a solution is adjusted to 8~9 due to the presence of a by-product diphenoquinone. However, since a reaction is more stably carried out in an oxidative coupling using 2,3,6-trimethylphenol having a substituent at the 3-site, production is effectively carried out under a high alkali condition of pH=approximately 13 (Japanese Patent Application No. 2001-319064). Further, concerning an oxidation polymerization reaction, as shown in Japanese patent application No. 2001-196569, it becomes possible to effectively produce the bifunctional phenylene ether oligomer by copolymerization of, as a bivalent phenol, the before-mentioned diol obtained from 2,3,6-trimethylphenol with, as a monovalent phenol, 2,6-dimethylphenol alone, 2,3,6-trimethylphenol alone or a mixture of 2,6-dimethylphenol and 2,3,6-trimethylphenol. Furthermore, concerning thermosetting derivatives (cyanate compound, epoxy compound, allyl compound) derived from these phenols, it is estimated that an increase in the number of methyl groups serves to attain low dielectric characteristics. That is, it has been found that the presence of a substituent at a 3-site is very important for the present invention.

The bifunctional phenylene ether oligomer which is an intermediate product of the present invention has a structure represented by the formula (1) in which —X— is defined by the formula (2') and Y—O— is an arrangement of at least one kind of structure defined by the formula (3') or a random arrangement of at least two structures defined by the formula (3'). In the formulae, R2 to R13, a and b are as defined in the formula (1) in the present invention 1. That is, it is a phenylene ether oligomer in which it is essential that R2, R3, R4, R8, R9, R10 and R11 are not an hydrogen atom.

Preferably, —X— has a structure represented by the formula (5) in which R2, R3, R4, R7, R8 an R9 are a methyl group, and R5 and R6 are a hydrogen atom and Y—O— preferably has an arrangement structure of the formula (6) alone in which R10, R11 and R12 are a methyl group and R13 is a hydrogen atom or the formula (7) alone in which R10 and R11 are a methyl group and R12 and R13 are a hydrogen atom, or a random arrangement structure of the formula (6) and the formula (7).

The bifunctional phenylene ether oligomer which is an intermediate product in the present invention will be explained. The phenylene ether oligomer represented by the formula (1) is effectively produced by oxidatively polymerizing a bivalent phenol represented by the formula (2) with a monovalent phenol defined by the formula (3) or a mixture of monovalent phenols defined by the formula (3) in toluene-alcohol or a ketone solvent.

As a monovalent phenol of the formula (3), particularly, there is preferably used a monovalent phenol having substituents at 2- and 6-sites alone or in combination with a monovalent phenol having substituent(s) at a 3-site or at 3- and 5-sites in addition to 2- and 6-sites. More preferably, when the monovalent phenol having substituents at 2- and 6-sites is used alone, 2,6-dimethylphenol or 2,3,6-trimethylphenol is preferred. When used in combination, 2,6-dimethylphenol and 2,3,6-trimethylphenol are preferred.

The thermosetting phenylene ether oligomer compound of the present invention is represented by the formula (4). That is, —X— is represented by the formula (2') and Y—O— is an arrangement of one kind of structure defined by the formula (3') or a random arrangement of at least two kinds of structures defined by the formula (3'). X, Y, a and b are as defined in the formula (1). Z is an organic group having at least one carbon atom, which organic group may contain an oxygen atom. Each of c and d is an integer of 0 or 1.

$$R1\!\!-\!\!\left[\,z\,\right]_c\!\!-\!\!\left[\,O\!-\!Y\,\right]_a\!\!-\!\!\left(\,O\!-\!X\!-\!O\,\right)\!\!-\!\!\left[\,Y\!-\!O\,\right]_b\!\!-\!\!\left[\,z\,\right]_d\!\!-\!\!R1 \quad (4)$$

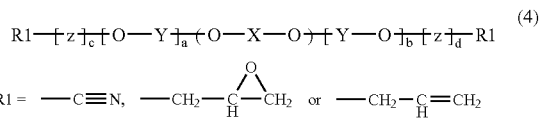

At the Z site, an organic group which has at least one carbon atom and may contain an oxygen atom can be located. Examples thereof include —(—CH$_2$—)—, —(CH$_2$—CH$_2$)—, and —(—CH$_2$—Ar—O—)—. The above organic group shall not be limited to these examples. The method for addition includes a method in which the organic groups are directly added to the intermediate product represented by the formula (1) and a method using a halide having a long carbon chain at a derivative synthesis time. The method shall not be limited to these methods.

For convenience sake, the following explanations will be done on the basis of a derivative from intermediate product represented by the formula (1) which is the simplest structure. The bifunctional phenylene ether oligomer of the formula (1) formula (1) is used as an intermediate product for producing the thermosetting phenylene ether oligomer compound. The bifunctional phenylene ether oligomer may be used in the form of a powder separated from a reaction solution or in the form of a solution thereof in a reaction solution.

An example of the process for producing the cyanate compound of the present invention will be explained. The cyanate compound is synthesized by reacting the above bifunctional compound having phenolic hydroxyl groups at both terminals, represented by the formula (1), as an intermediate product, with cyanogen halide such as cyanogen chloride or cyanogen bromide in the presence of a base in dehydrohalogenation.

Typical examples of the base include tertiary amines such as trimethylamine, triethylamine, tripropylamine, dimethylaniline and pyridine, sodium hydroxide, potassium hydroxide, sodium methoxide, sodium ethoxide, calcium hydroxide, sodium carbonate, potassium carbonate and sodium bicarbonate. The base shall not be limited to these.

Although not specially limited, typical examples of a solvent for the reaction includes toluene, xylene, chloroform, methylene chloride, carbon tetrachloride, chlorobenzene, nitrobenzene, nitromethane, acetone, methyl ethyl ketone, tetrahydrofuran and dioxane.

When cyanogen chloride is used, the reaction temperature is preferably between −30° C. and +13° C. (boiling point). When cyanogen bromide is used, it is preferably between −30° C. and +65° C.

An example of the production process for the epoxy compound of the present invention will be explained. The epoxy compound is synthesized by reacting the above bifunctional compound having phenolic hydroxyl groups at both terminals, represented by the formula (1), as an intermediate product, with a halogenated glycidyl such as epichlorohydrin in the presence of a base in dehydrohalogenation.

Typical examples of the base include sodium hydroxide, potassium hydroxide, sodium methoxide, sodium ethoxide, calcium hydroxide, sodium carbonate, potassium carbonate and sodium bicarbonate. The base shall not be limited to these.

The reaction temperature is preferably between −10° C. and 110° C.

An example of the production process for the allyl compound of the present invention will be explained. The allyl compound is synthesized by reacting the above bifunctional compound having phenolic hydroxyl groups at both terminals, represented by the formula (1), as an intermediate product, with an allyl halide such as allyl bromide or allyl chloride, or 4-bromo-1-butene having a long carbon chain in the presence of a phase transfer catalyst under a base condition in dehydrohalogenation.

Typical examples of the phase transfer catalyst include tertiary amines such as trimethylamine and tetramethylethylenediamine, quaternary ammonium salts such as tetrabutylammonium chloride, tetrabutylammonium bromide, tetrabutylammonium iodide, benzyltri-n-butylammonium chloride, benzyltri-n-butylammonium bromide and benzyl-n-butylammonium iodide and quaternary phosphonium salts. The phase transfer catalyst shall not be limited to these.

Typical examples of the base include sodium hydroxide, potassium hydroxide, sodium methoxide, sodium ethoxide, calcium hydroxide, sodium carbonate, potassium carbonate and sodium bicarbonate. The base shall not be limited to these.

The reaction temperature is preferably between −10° C. and 60° C.

The thermosetting phenylene ether oligomer compound of the present invention can be cured alone or it can be cured as a resin composition further containing cyanate compounds, epoxy compounds, polymerizable compounds and/or catalysts.

Any known curing methods can be employed for curing the thermosetting phenylene ether oligomer compound. Examples of the above cyanate compounds include m- or p-phenylenebiscyanate, 1,3,5-tricyanatebenzene, 4,4'-dicyanatobiphenyl, 3,3'5,5'-tetramethyl-4,4'-dicyanatebiphenyl, 2,3,3',5,5'-pentamethyl-4,4'-dicyanatebiphenyl, 2,2'3,3',5,5'-hexamethyl-4,4'-dicyanatebiphenyl, bis(4-cyanatephenyl)methane, 1-(2,3,5-trimethyl-4-cyanatephenyl)-1-(3,5,-dimethyl-4-cyanatephenyl)methane, bis(2,3,5-trimethyl-4-dicyanatephenyl)methane, 1,1-bis(4-cyanatephenyl)ethane, 1-(2,3,5-trimethyl-4-cyanatephenyl)-1-(3,5,-dimethyl-4-cyanatephenyl)ethane, 1,1-bis(2,3,5-trimethyl-4-dicyanatephenyl)ethane, 2,2-bis(4-cyanatephenyl)propane, 2-(2,3,5-trimethyl-4-cyanatephenyl)-2-(3,5,-dimethyl-4-cyanatephenyl)propane, 2,2-bis(2,3,5-trimethyl-4-dicyanatephenyl)propane, bis(4-cyanatephenyl)ether, bis(4-cyanatephenyl)sulfone, bis(4-cyanatephenyl) sulfide, 4,4'-dicyanatebenzophenone, and tris(4-cyanatephenyl)methane. That is, the cyanate compounds are biphenols to which an aromatic ring having a cyanate group directly bonds, bis or polycyanate compounds to which an aromatic ring having a cyanate group bonds at a crosslinking portion, prepolymers of these cyanate compounds, prepolymers of these cyanate compounds with diamines, and a cyanate-group-containing novolak type phenolic resin derived from a novolak resin which is a reaction product between phenols such as phenol and o-cresol and formaldehyde. These cyanate compounds may be used alone or in combination.

The above-mentioned prepolymers of the cyanate ester compound will be explained. A polyfunctional cyanate ester compound having at least two cyanate groups per molecule is polymerized by forming a triazine ring by trimerization of cyanate groups. A substance having a molecular weight of 200 to 6,000 is used as a prepolymer. The above prepolymers can be obtained by polymerizing the above polyfunctional cyanate ester compound monomers in the presence of a catalyst selected from acids such as mineral acids and Lewis acids; bases such as sodium alkoxide and tertiary amines; or salts such as sodium carbonate. The prepolymers partially contain monomers and have the form of a mixture of a monomer and a polymer, and these prepolymers are preferably used when a cured product is produced.

The polymerizable compounds include bismaleimide, an epoxy resin and the like. These may be used as a mixture thereof.

Examples of the bismaleimide includes N,N'-diphenylmethanebismaleimide, N,N'-phenylenebismaleimide, N,N'-diphenyletherbismaleimide, N,N'-dicyclohexylmethanebismaleimide, N,N'-xylenebismaleimide, N,N'-diphenylsulfonebismaleimide, N,N'-tolylenebismaleimide, N,N'-xylylene bismaleimide, N,N'-diphenylcyclohexane bismaleimide, N,N'-dichloro-diphenylmethane bismaleimide, N,N'-diphenylcyclohexane bismaleimide, N,N'-diphenylmethane bismethylmaleimide, N,N'-diphenyletherbismethylmaleimide, N,N'-diphenylsulfonebismethylmaleimide, N,N'-ethylenebismaleimide, N,N'-hexamethylenebismethylmaleimide, prepolymers of these N,N'-bismaleimide compounds, prepolymers of these bismaleimide compounds with diamines, and maleimide-modified compounds or methylmaleimide-modified compounds of aniline-formalin polycondensates.

Examples of the above epoxy resin include biphenol and a resin obtained by substituting at least one site of the 2-, 2'-, 3-, 3'-, 5- and 5'-sites of biphenol with a halogen atom, an alkyl group having 6 or less carbon atoms or a phenyl group; bisphenol A and a resin obtained by substituting at least one site of the 2-site, the 3-site and the 5-site of bisphenol A with a halogen atom, an alkyl group having 6 or less carbon atoms or a phenyl group; bisphenol F and a resin obtained by substituting at least one site of the 2-site, the 3-site and the 5-site of bisphenol F with a halogen atom, an alkyl group having 6 or less carbon atoms or a phenyl group; glycidyl ether compounds derived from bivalent or at least trivalent phenols such as hydroquinon, resorcin, tris-4-(hydroxyphenyl)methane and 1,1,2,2-tetrakis(4-hydroxyphenyl)ethane; a novolak type epoxy resin derived from a novolak resin which is a reaction product between phenols such as phenol and o-cresol and formaldehyde; amine type epoxy resins derived from aniline, p-aminophenol, m-aminophenol, 4-amino-m-cresol, 6-amino-m-cresol, 4,4'-diaminodiphenylmethane, 3,3'-diaminodiphenylmethane, 4,4'-diaminodiphenylether, 3,4'-diaminodiphenylether, 1,4-bis(4-aminophenoxy)benzene, 1,4-bis(3-aminophenoxy)benzene, 1,3-bis(4-aminophenoxy)benzene, 1,3-bis(3-aminophenoxy)benzene, 2,2-bis(4-aminophenoxyphenyl)propane, p-phenylenediamine, m-phenylenediamine, 2,4-toluenediamine, 2,6-toluenediamine, p-xylylenediamine, m-xylylenediamine, 1,4-cyclohexane-bis(methylamine), 5-amino-1-(4'-aminophenyl)-1,3,3-trimethylindane, 6-amino-1-(4'-aminophenyl)-1,3,3-trimethylindane and the like; glycidyl ester compounds derived from aromatic carboxylic acids such as p-oxybenzoic acid, m-oxybenzoic acid, terephthalic acid and isophthalic acid; hydantoin type epoxy resins derived from 5,5-dimethylhydantoin and the like; alicyclic epoxy resins such as 2,2-bis(3,4-epoxycyclohexyl)propane, 2,2-bis[4-(2,3-epoxypropyl)cyclohexyl)propane, vinylcyclohexenedioxide and 3,4-epoxycyclohexylmethyl-3,4-epoxycyclohexane carboxylate; triglycidyl isocyanurate, and 2,3,6-triglycidoxy-S-triazine. These epoxy resins may be used alone or in combination.

such as cobalt naphthenate, lead stearate, tin oleate, tin octylate, zinc octylate and titanium butyrate, chlorides such as aluminum chloride, tin chloride and zinc chloride, and chelate metals. These catalyst may be used alone or in combination.

The above resin composition may contain an extending agent, a filler (containing organic and inorganic fillers), a reinforcing agent or a pigment as required. Examples of these include silica, calcium carbonate, antimony trioxide, kaoline, titanium dioxide, zinc oxide, mica, barite, carbon black, polyethylene powder, polypropylene powder, glass powder, aluminium powder, iron powder, copper powder, glass fiber, carbon fiber, alumina fiber, asbestos fiber, aramid fiber, glass woven fabric, glass unwoven fabric, aramid unwoven fabric and liquid crystal polyester unwoven fabric. These may be used alone or in combination.

Further, the resin composition containing these is used for molding, lamination, an adhesive or a composite material such as a copper-clad laminate. Particularly, when the cyanate compound alone, the epoxy compound alone or a combination of the cyanate compound and the epoxy compound is used, typical examples of uses are prepreg obtained by semi-curing the resin and a laminate obtained by curing the above prepreg. Further, when the epoxy compound is used, a typical example is a use for a semiconductor sealing material.

The present invention 3 is directed to an epoxy acrylate compound represented by the formula (8),

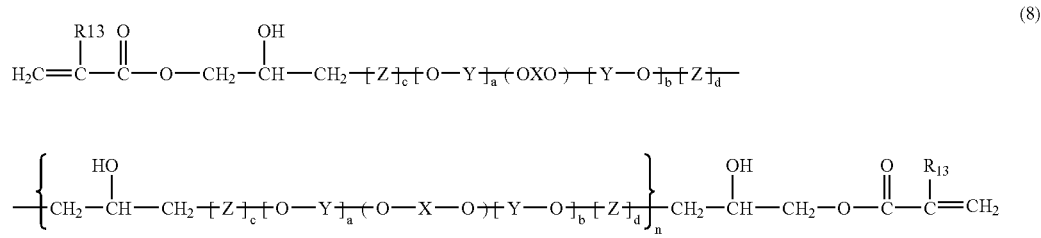

The above resin composition may contain a curing agent corresponding to each of the ingredients. When the epoxy compound of the present invention is used or the resin composition contains the epoxy resin in a constitution, there may be used, as a curing agent, dicyandiamide, tetramethylguanidine, an aromatic amine, a phenol novolak resin, a cresol novolak resin, acid anhydride, and various aliphatic and alicyclic amines. In this case, the curing agents may be used alone or in combination. As an aromatic amine, the above aromatic diamines are typical. As a curing agent used when the resin composition contains the cyanate compound or bismaleimide, the above aromatic diamines and alicyclic diamines are typical. Each of the curing agents may be incorporated in the resin composition in the form of the curing agent alone or may be incorporated in the resin composition in the form of a prepolymer of an ingredient to which each curing agent corresponds.

The resin composition can be thermally cured in a comparatively short time without containing a catalyst. However, according to the use of a catalyst, a molding temperature can be decreased and the curing time can be shortened. As such a catalyst, there may be used amines such as N,N-dimethylaniline, triethylenediamine and tri-n-butylamine, imidazoles such as 2-methylimidazole and 2-ethyl-4-methylimidazole, phenols such as phenol and resorcin, organometallic salts wherein R13 is a hydrogen atom or a methyl group, —X—, Y—O—, a and b are as defined in the formula (1), Z, c and d are as defined in the formula (4), and n is an integer of 0 to 10.

Further, the present invention relates to an acid-modified epoxy acrylate compound obtained by further reacting the epoxy acrylate compound of the formula (8) with a carboxylic acid or its anhydride. Further, the present invention relates to a curable resin composition containing the above epoxyacrylate compound and/or the above acid-modified epoxy acrylate compound and further relates to a cured product obtained by curing the above curable resin composition.

As for a reaction method, the epoxy acrylate compound of the formula (8) is preferably produced according to a known method, for example a method disclosed in JP-B-44-31472 or JP-B-45-1465. That is, typically, for example, the epoxy acrylate compound of the formula (8) can be obtained by reacting an epoxy compound represented by the formula (9) with an acrylic acid, a methacrylic acid or a mixture of an acrylic acid and a methacrylic acid. The epoxy compound of the formula (9) is produced by, for example, the method disclosed in Japanese Patent Application No. 2001-353194.

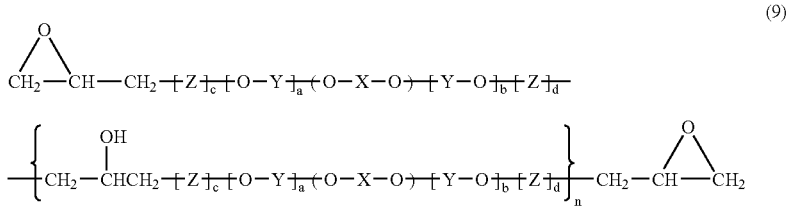

(9)

When the epoxy acrylate compound of the formula (8) in the present invention 3 is produced, the amount of the acrylic acid, the methacrylic acid or the mixture of these based on the epoxy resin of the formula (9) is not specially limited. Preferably, the amount of the acrylic acid, the methacrylic acid or the mixture of these per 1 chemical equivalent of an epoxy group of the epoxy compound composition is 0.1 to 5 chemical equivalents, more preferably 0.3 to 3 chemical equivalents.

In the reaction, it is preferable to add a diluent. Examples of the diluent include alcohols such as methanol, ethanol, propanol, butanol, ethylene glycol, methyl cellosolve, ethylcellosolve, dipropylene glycol monomethyl ether and diethylene glycol monomethyl ether, esters such as methyl cellosolve acetate, ethylcellosolve acetate, dipropylene glycol monomethyl ether acetate, diethylene glycol monomethyl ether acetate and diethylene glycol monoethyl ether acetate, ketone solvents such as methyl ethyl ketone and methyl isobutyl ketone, and aromatic compounds such as benzene, toluene, xylene, chlorobenzene, dichlorobenzene and solvent naphtha.

Further, it is preferable to use a catalyst for promoting the reaction. Preferable concrete examples of the catalyst include amines such as triethylamine, dimethylbutyl amine and tri-n-butyl amine, quaternary ammonium salts such as tetramethylammonium salt, tetraethylammonium salt, tetrabutylammonium salt and benzyltrimethylammonium salt, quaternary phosphonium salts, phosphines such as triphenylphosphine, and imidazoles such as 2-methylimidazole and 2-ethyl-4-methylimidazole. The amount of the catalyst based on a mixture of reaction raw materials is preferably 0.1 to 10% by weight, more preferably 0.2 to 3% by weight. Further, it is preferred to use a polymerization inhibitor for preventing a polymerization during the reaction. Examples of the polymerization inhibitor include hydroquinone, methyl hydroquinone, hydroquinone monomethyl ether, 4-methylquinoline and phenothiazine. Further, for inhibiting a polymerization reaction due to unsaturated bonds, the reaction can be carried out under a flow of air or the like according to circumstances. In this case, an antioxidant such as 2,6-di-t-butyl-4-methylphenol may be used for preventing an oxidation reaction due to the air.

Although the reaction temperature varies depending upon the catalyst, preferred is a temperature at which the reaction of the epoxy compound of the formula (9) with the acrylic acid or the methacrylic acid advances and no thermal polymerizations of raw materials, an intermediate product and a generation product occur. More preferably, the reaction temperature is 60° C. to 150° C., particularly preferably 70° C. to 130° C. Although the reaction-time depends on the reaction temperature, it is preferably 1 to 15 hours. After the completion of the reaction, an excess (meth)acrylic acid and an excess diluent may be removed by distillation or other methods, or these materials can be used without removing.

Next, the acid-modified epoxy acrylate compound of the present invention 3 will be explained. The acid-modified epoxy acrylate compound of the present invention is produced by reacting the above epoxy acrylate compound obtained from the epoxy compound of the formula (9) and acrylic acid, methacrylic acid or a mixture of these, with a carboxylic acid or its anhydride. The carboxylic acid is a monovalent or polyvalent carboxylic acid, and it is preferably a monovalent or polyvalent aliphatic carboxylic acid or a monovalent or polyvalent aromatic carboxylic acid.

Examples of the carboxylic acid or its anhydride include maleic acid, succinic acid, itaconic acid, phthalic acid, tetrahydrophthalic acid, hexahydrophthalic acid, methyltetrahydrophthalic acid, methylhexahydrophthalic acid, chlorendic acid, methyl nadic acid, trimellitic acid, pyromellitic acid, benzophenone tetracarboxylic acid, 3,3'4,4'-biphenyl tetracarboxylic acid, cyclohexane tetracarboxylic acid, butane tetracarboxylic acid, naphthalene-1,4,5,8-tetracarboxylic acid, 3,3'4,4'-diphenyl sulfone tetracarboxylic acid, 4,4'-oxydiphthalic acid, cyclopentane tetracarboxylic acid, and anhydrides of these. The carboxylic acid or its anhydride shall not be limited to these examples. The amount of the carboxylic acid or its anhydride per 1 chemical equivalent of a hydroxyl group in the above epoxyacrylate compound is 0.01 to 1.2 chemical equivalents, preferably 0.05 to 1 chemical equivalent.

At the time of the reaction, various known esterification catalysts, a diluent mentioned above, and the like may be further added as required. Although the reaction temperature is not specially limited, preferred is a temperature at which no thermal polymerization of the epoxy acrylate compound, etc., as a raw material, occurs. It is preferably 60° C. to 130° C. Although the reaction time depends on the reaction temperature, it is preferably 1 to 80 hours.

After the reaction, the acid-modified epoxy acrylate compound of the present invention 3 can be separated by a known method such as distillation. Further, the acid-modified epoxy acrylate compound of the present invention may contain an epoxy group in a molecule. That is, as described before, when the amount of the acrylic acid, the methacrylic acid of the mixture of these based on the epoxy compound is adjusted to a desired amount within the above range, an unreacted epoxy group is left in the obtained epoxy acrylate compound. The thus-obtained epoxy acrylate compound is further acid-modified, whereby an acid-modified epoxy acrylate compound having an epoxy group is obtained. The acid value of the acid-modified epoxy acrylate compound can be properly adjusted as required. It is preferably 20 to 200 mgKOH/g, more preferably 30 to 150 mgKOH/g.

Then, the curable resin composition of the present invention 3 will be explained. The curable resin composition is characterized in that it contains the above epoxy acrylate compound and/or the acid-modified epoxy acrylate compound of the present invention. The curable resin composition of the present invention 3 may contain a known epoxy resin, an oxetane resin, a compound having an ethylenic unsaturated compound, a photopolymerization initiator and/or a thermal polymerization initiator, a photosensitizer and the like. As the epoxy acrylate compound and/or the acid-modified epoxy acrylate compound of the present invention 3, the above reaction products may be used as they are.

The epoxy resin can be selected from generally known epoxy resins. Examples of the epoxy resin include a bisphenol A type epoxy resin, a bisphenol F type epoxy resin, a biphenyl type epoxy resin, a phenol novolak type epoxy resin, a cresol novolak type epoxy resin, a xylene novolak type epoxy resin, triglycidyl isocyanurate, an alicyclic epoxy resin, a dicyclopentadiene novolak type epoxy resin, a biphenyl novolak type epoxy resin, epoxy resins having a PPE structure disclosed in Japanese patent application Nos. 2001-353194 and 2002-018508, and flame-retardant epoxy resins obtained by brominating any one of these epoxy resins. These epoxy resins may be used alone or in combination.

The oxetane resin can be selected from generally known oxetane resins. Examples of the oxetane resin include alkyl oxetanes such as oxetane, 2-methyloxetane, 2,2-dimethyloxetane, 3-methyloxetane and 3,3-dimethyloxetane, 3-methyl-3-methoxymethyloxetane, 3,3'-di(trifluoromethyl) perfluorooxetane, 2-chloromethyloxetane, 3,3-bis(chrolomethyl) oxetane, OXT-101 (trade name, supplied by TOAGOSEI Co., Ltd.) and OXT-121 (trade name, supplied by TOAGOSEI Co., Ltd.). These oxetane resins may be used alone or in combination.

When the epoxy resin and/or the oxetane resin are used in the curable resin composition of the present invention 3, an epoxy resin curing agent and/or an oxetane resin curing agent may be used. The epoxy resin curing agent is selected from generally known curing agent. Examples of the epoxy resin curing agent include imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole; amine compounds such as dicyandiamide, benzyldimethylamine and 4-methyl-N,N-dimethylbenzylamine; and phosphine compounds such as phosphonium compounds. The oxetane resin curing agent can be selected from known cationic polymerization initiator. Commercially available examples include SAN-AID SI-60L, SAN-AID SI-80L, SAN-AID SI-100L (supplied by Sanshin Chemical Industry Co., Ltd.), CI-2064 (supplied by Nippon Soda Co., Ltd.), IRGACURE261 (supplied by Ciba Specialty Chemicals), ADEKAOPTMER SP-170, ADEKAOPTMER SP-150, (supplied by Asahi Denka Kogyo K.K.), and CYRACURE UVI-6990 (supplied by Union Carbide Corporation). A cationic polymerization initiator may be used as an epoxy resin curing agent. These curing agents may be used alone or in combination.

The compound having an ethylenic unsaturated group can be selected from generally known compounds having an ethylenic unsaturated group. Examples thereof include (meth) acrylates of monohydric and polyhydric alcohols such as 2-hydroxyethyl(meth)acrylate, 2-hydroxypropyl(meth)acrylate, polypropylene glycol di(meth)acrylate, trimethylol propane di(meth)acrylate, trimethylol propane tri(meth)acrylate, pentaerythritol tetra(meth)acrylate and dipentaerythritol hexa(meth)acrylate, and epoxy acrylates such as a bisphenol A type epoxy acrylate and a bisphenol F type epoxy acrylate. These compounds having an ethylenic unsaturated group may be used alone or in combination.

The photopolymerization initiator can be selected from generally known photopolymerization initiators. Examples of the photopolymerization initiator include α-diketones such as benzyl and diacetyl, acyloin ethers such as benzoyl ethyl ether and benzoin isopropyl ether, thioxanthones such as thioxanthone, 2,4-diethylthioxanthone and 2-isopropylthioxanthone, benzophenones such as benzophenone and 4,4'-bis(dimethylamino)benzophenone, acetophenones such as acetophenone, 2,2'-dimethoxy-2-phenylacetophenone and β-methoxy acetophenone, and aminoacetophenones such as 2-methyl-1-[4-(methylthio)phenyl]-2-morpholinopropane-1-one and 2-benzyl-2-dimethylamino-1-(-4-morpholinophenyl)-butanone-1. These photopolymerization initiators are used alone or in combination.

Further, the photopolymerization initiator may be used in combination with one kind of or at least two kinds of known photosensitizer(s). Examples of the photosensitizer include N,N-dimethylaminoethylbenzoate, N,N-dimethylaminoisoamylbenzoate, triethanolamine and triethylamine.

The thermal polymerization initiator may be selected from generally known thermal polymerization initiators. Examples thereof include peroxides such as benzoyl peroxide, p-chlorobenzoyl peroxide, di-t-butylperoxide, diisopropyl peroxy carbonate and di-2-ethylhexylperoxycarbonate, and azo compounds such as azobisisobutylonitrile.

Further, when the curable resin composition of the present invention 3 is produced, there may be added a known additive such as an inorganic filler, a color pigment, an antifoamer, a surface conditioner, a flame retardant, an ultraviolet absorber, an antioxidant, a polymerization inhibitor or a flow regulator, as required. Examples of the inorganic filler includes silicas such as natural silica, fused silica and amorphous silica, white carbon, titanium white, aerosil, alumina, talc, natural mica, synthetic mica, kaolin, clay, aluminum hydroxide, barium sulfate, E-glass, A-glass, C-glass, L-glass, D-glass, S-glass and M-glass G20. The thus-obtained curable resin composition is suitable for various uses such as a solder resist composition, buildup wiring board materials, insulating coatings, adhesives, printing inks and coating materials.

The cured product of the present invention 3 can be obtained by curing the curable resin composition of the present invention, obtained by the above method, according to a known curing method such as a method using an electron beam, ultraviolet light or heat. When ultraviolet light is used for the curing, there may be used a low-pressure mercury lamp, an intermediate-pressure mercury lamp, a high-pressure mercury lamp, an ultrahigh-pressure mercury lamp, a xenon lamp and a metal halide lamp as a light source for ultraviolet light.

The epoxy resin composition of the present invention 4 is a thermosetting resin composition excellent in dielectric characteristics, moldability and heat resistance. It contains as a main ingredient a phenylene ether oligomer epoxy compound having an epoxy group at each terminal, represented by the formula (9), and it is suitable for use as an ingredient for an epoxy resin composition for laminates.

That is, the present invention 4 provides an epoxy resin composition for laminates, containing as ingredients a phenylene ether oligomer epoxy compound having a number average molecular weight of 700 to 3,000 and having an epoxy group at each terminal, represented by the formula (9), and a curing agent,

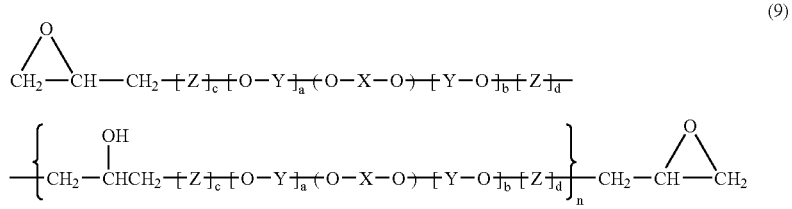

(9)

wherein —X—, Y—O—, a and b are as defined in the formula (1), Z, c and d are as defined in the formula (4), and n is an integer of 0 to 10, preferably 0 to 6.

The present invention 4 further provides an epoxy resin composition for laminates, which composition contains a phenylene ether oligomer epoxy compound having a number average molecular weight of 700 to 3,000 and having an epoxy group at each terminal, represented by the formula (9), and a cyanate ester resin as ingredients.

In the present invention 4, concerning the above epoxy resin composition containing the epoxy compound and the curing agent, the phenylene ether oligomer epoxy compound having an epoxy resin at each terminal represented by the formula (9) preferably has a structure in which at least R2, R3, R4, R8 and R9 in the formula (2'), which represents —X—, are a methyl group, further at least one of R5, R6 and R7 in the formula (2') may be a methyl group and Y—O— is an arrangement of the formula (6) or the formula (7) or a random arrangement of the formula (6) and the formula (7)

Since the epoxy resin composition of the present invention 4 contains the phenylene ether oligomer epoxy compound having an epoxy group at each terminal represented by the formula (9), it has a low dielectric constant and excellent flexibility and the melt viscosity thereof can be decreased. When the melt viscosity of the resin composition is low, the embeddability of the resin is good at a laminate-molding time and no voids occur so that moldability is excellent.

The phenylene ether oligomer epoxy compound, represented by the formula (9), having an epoxy group at each terminal (to be referred to as "bifunctional PEO-2Ep" hereinafter) used in the present invention 4 will be explained.

The above bifunctional PEO-2Ep is obtained by reacting the phenylene ether oligomer (to be referred to as "bifunctional PEO" hereinafter) of the formula (1) obtained by oxidative copolymerization of the bivalent phenol and the monovalent phenol, with a halogenated glycidyl such as epichlorohydrin in the presence of a base in dehydrohalogenation. It may be used as a powder separated from a reaction liquid or as a solution thereof in a reaction liquid.

An example of the process for producing the bifunctional PEO-2Ep of the present invention 4 will be shown. The above compound having phenolic hydroxyl groups at both terminals, represented by the formula (1), is reacted with a halogenated glycidyl such as epichlorohydrin in the presence of a base in dehydrohalogenation, whereby the bifunctional PEO-2Ep is synthesized.

The number average molecular weight of the obtained bifunctional PEO-2Ep is limited in the range of from 700 to 3,000. When the above number average molecular weight exceeds 3,000, the melt viscosity of the resin composition increases. When it is smaller than 700, mechanical strength or heat resistance is decreased. The above bifunctional PEO-2Ep has a low melt viscosity so that its flowability is high. It is excellent in compatibility with a different resin. Further, since it has epoxy groups at both terminals, the resin composition containing it has good adhesive properties. As a result thereof, when the resin composition is exposed to a high temperature at soldering or the like after moisture absorption, the occurrence of swelling is prevented. Further, since a polyphenylene ether resin is a material having low dielectric characteristics, there can be provided a laminate having low dielectric characteristics.

The curing agent, which is an ingredient of the epoxy resin composition for laminates provided by the present invention 4, includes generally used curing agents such as amine type curing agents typified by primary amine and secondary amine, phenol type curing agents typified by bisphenol A and phenol novolak, acid anhydride type curing agents, and cyanate-ester type curing agents. These curing agents may be used alone or in combination.

The bifunctional PEO-2Ep composition of the present invention can be used in combination with various resins according to a purpose or use. Specific examples of the resins include various epoxy resins; modified epoxy resins, oxetane resins, acrylates, methacrylates; polyallyl compounds such as diallyl benzene and diallyl terephthalate; vinyl compounds such as N-vinyl-2-pyrolidone and divinyl benzene; polymerizable double-bond-containing monomers such as unsaturated polyester; polyfunctional maleimides; polyimides; rubbers such as polybutadiene, thermoplastic resins such as polyethylene and polystyrene; engineering plastics such as a ABS resin and polycarbonate; and a cyanate ester resin. The above resins shall not be limited to these resins.

Further, the resin composition may contain various additives such as a known inorganic or organic filler, a dye, a pigment, a thickener, a lubricant, an antifoamer, a coupling agent, a photosensitizer, an ultraviolet absorber and a flame retardant, as required.

Examples of the cyanate ester compound used in the present invention 4 include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, 4,4'-dicyanato-3,3,5,5'-tetramethylbiphenyl, 4,4'-dicyanato-2,2',3,3',5,5'-hexamethylbiphenyl, and cyanates obtained by a reaction of novolak with cyanogen halide.

Although the composition of the present invention 4 undergoes curing itself under heat, a heat-curing catalyst can be incorporated in the composition for increasing the curing rate and improving workability and economic efficiency. There may be used a generally known heat-curing catalyst as a heat-curing catalyst for the resin to be used in combination.

A copper-clad laminate obtained by using the bifunctional PEO-2Ep composition of the present invention 4 is particularly suitably used for a printed wiring board which is required to have low dielectric characteristics. The copper-clad laminate of the present invention 4 can be produced by a general method. That is, it is a method in which a base material is impregnated with a resin varnish which is a solution of a thermosetting resin composition in an organic solvent, the base material is heat-treated to obtain prepreg, and then the prepreg and a copper foil are laminated and molded under heat to obtain a copper-clad laminate. However, the production method of the copper-clad laminate of the present invention shall not be limited to this method.

The organic solvent includes acetone, methyl ethyl ketone, ethylene glycol monomethyl ether acetate, propylene glycol dimethyl ether, toluene, xylene, tetrahydrofuran and N,N-dimethylformamide. The solvent is not specially limited and various organic solvents may be used. These solvents may be used alone or in combination. The base material to be impregnated with the resin varnish includes all base materials used for a thermosetting resin laminate. Example thereof includes inorganic base materials such as a glass cloth and a glass unwoven fabric; and organic base materials such as a polyamide unwoven fabric and a liquid crystalline polyester unwoven fabric. For utilizing the low dielectric characteristics of the present invention, it is more effective to use a base material having excellent dielectric characteristics such as D glass cloth or NE glass cloth.

The heat-treatment of the prepreg is properly selected depending upon the kinds and the amounts of the solvent used, the resin constitution, the catalyst added and other additives, while it is generally carried out at a temperature of 100 to 250° C. for 3 to 30 minutes. The method of laminating and heating the prepreg and the copper foil varies depending upon the kind of the prepreg and the form of the copper foil. Generally, these materials are preferably thermally press-molded in vacuum at a temperature of 170 to 230° C. under a pressure of 10 to 30 kg/cm² for 40 to 120 minutes.

The present invention 5 provides a sealing epoxy resin composition containing as ingredients an epoxy resin, a curing agent, an inorganic filler and a phenylene ether oligomer compound having a number average molecular weight of 700 to 3,000 and having an epoxy group at each terminal, represented by the formula (9).

According to the present invention 5, there is provided a sealing epoxy resin composition capable of giving a sealing layer which is free from the occurrence of cracks, when exposed to a high temperature such as a solder reflow, and has a low dielectric constant.

According to the present invention 5, there is provided, as a more preferable product, a sealing epoxy resin composition according to the above, wherein, in the phenylene ether oligomer compound having an epoxy group at each terminal represented by the formula (9), R2, R3, R4, R8 and R9 in —X— are a methyl group, further at least one of R5, R6 and R7 in —X— may be a methyl group, and Y—O— is an arrangement of the formula (6) or the formula (7) or a random arrangement of the formula (6) and the formula (7).

According to the present invention 5, there is provided a sealing epoxy resin composition according to the above, wherein the content of the phenylene ether oligomer compound having an epoxy group at each terminal represented by the formula (9) is in the range of from 1 to 60% by weight based on the total amount of the epoxy resin, the curing agent, the inorganic filler and the oligomer compound itself.

According to the present invention 5, there is provided a sealing epoxy resin composition according the above, wherein the content of the inorganic filler is in the range of from 15 to 95% by weight based on the total amount of the epoxy resin, the curing agent, the inorganic filler and the oligomer compound.

Since the epoxy resin composition of the present invention 5 contains the phenylene ether oligomer compound having an epoxy group at each terminal, it has a low dielectric constant and excellent mechanical strength and has a low melt viscosity. When the melt viscosity of the above resin composition is low, a resin flowability is good at a sealing-molding time and no voids occur so that moldability is excellent.

The bifunctional PEO-2Ep has a low melt viscosity and fine flowability and is excellent in compatibility with the epoxy resin. Further, it has epoxy groups at both terminals so that the resin composition has high adhesive properties and its sealing layer is further excellent in strength under heat. As a result, when the sealing layer is exposed to a high temperature at soldering or the like, the occurrence of cracks can be prevented. Further, since a polyphenylene ether is a material having low dielectric characteristics, there can be provided a sealing layer having low dielectric characteristics.

In the sealing epoxy resin composition of the present invention 5, the content of the bifunctional PEO-2Ep is preferably in the range of from 1 to 60% by weight, more preferably 5 to 50% by weight, based on the total amount of the epoxy resin, the bifunctional PEO-2Ep and the curing agent. When the above content is lower than 1% by weight, cracks are apt to occur in the sealing layer. When the above content is higher than 60% by weight, the melt viscosity increases at a sealing-molding so that voids occur and moldability is decreased.

Examples of the inorganic filler which is an ingredient of the sealing epoxy resin composition of the present invention include inorganic powders such as silica and alumina. The preferable content of the inorganic filler varies depending upon a use.

For example, concerning a use as a sealing material for a potting molding, the content of the inorganic filler is preferably in the range of from 15 to 60% by weight, more preferably from 20 to 50-6 by weight, based on the total amount of the epoxy resin, the bifunctional PEO-2Ep, the curing agent and the inorganic filler. In this case of a use as a sealing material for a potting molding, when the content of the above inorganic filler is less than 15% by weight, the strength of a sealing layer is low. When the above content is more than 60% by weight, moldability decreases at a sealing-molding.

Further, concerning a use as a sealing material for a injection-molding, the content of the inorganic filler is preferably in the range of from 60 to 95% by weight, more preferably from 70 to 90% by weight, based on the total amount of the epoxy resin, the bifunctional PEO-2Ep, the curing agent and the inorganic filler. In this case of a use as a sealing material for a injection-molding, when the content of the above inorganic filler is less than 70% by weight, the moisture absorption coefficient of a sealing layer increases so that cracks are apt to occur. When the above content is more than 95% by weight, the melt viscosity increases at a sealing-molding so that voids occur and moldability decreases.

The above inorganic filler is preferably surface-treated with a coupling agent for improving conformability with the epoxy resin. Examples of the coupling agent include silane coupling agents such as γ-glycidoxypropyltrimethoxysilane, γ-aminopropyltriethoxysilane and N-phenyl-γ-aminopropyltrimethoxysilane.

The above sealing epoxy resin composition may contain a curing accelerator, a releasing agent, a coloring agent, a flame retardant and a stress reducing agent, as required, in addition to the epoxy resin, the bifunctional PEO-2Ep, the curing agent and the inorganic filler.

Examples of the above curing accelerator include tertiary amines such as 1,8-diazabicyclo(5,4,0)undecene-7, triethylenediamine and benzyldimethylamine, imidazoles such as 2-methylimidazole, 2-ethyl-4-methylimidazole, 2-phenylimidazole and 2-phenyl-4-methylimidazole, organic phosphines such as tributylphosphine and triphenylphosphine. Of these, triphenylphosphine improves the electric characteristics of a sealing layer and therefore triphenylphosphine is preferred.

Examples of the releasing agent include carnauba wax, stearic acid, montanoic acid and a carboxyl group-containing polyolefine. Examples of the coloring agent include carbon black. Examples of the above flame retardant include antimony trioxide. Examples of the stress reducing agent include silicone gel, silicone rubber and silicone oil.

According to the present invention 6, concerning a printed wiring board material, there are provided a thermosetting resin composition which satisfies severer requirements for lower dielectric characteristics without deteriorating conventional characteristic properties such as excellent moldability and heat resistance and which also has flexiability, a laminate using the same and a printed wiring board using the same.

The present invention 6 provides a resin composition for laminates, containing as an ingredient a phenylene ether oligomer cyanate compound having a number average molecular weight of 700 to 3,000 and having a cyanate group at each terminal, represented by the formula (10),

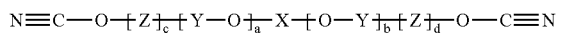

(10)

wherein —X—, Y—O—, a and b are as defined in the formula (1) and Z, c and d are as defined in the formula (4).

The present invention 6 further provides a resin composition for laminates, which contains as ingredients the phenylene ether oligomer cyanate compound having a number average molecular weight of 700 to 3,000 and having a cyanate group at each terminal, represented by the formula (10), a different cyanate ester resin and an epoxy resin.

Further, the present invention 6 provides a resin composition for laminates according to the above, wherein, in the cyanate compound of the formula (10), R2, R3, R4, R8 and R9 in —X— are a methyl group, further at least one of R5, R6 and R7 in —X— may be a methyl group, Y—O— is an arrangement of the formula (6) or the formula (7) or a random arrangement of the formula (6) and the formula (7).

The resin composition for laminates, provided by the present invention 6, contains the phenylene ether oligomer cyanate compound having a cyanate group at each terminal so that the resin composition has low dielectric characteristics and excellent flexibility and has a low melt viscosity. When the above melt viscosity of the resin composition is low, the embeddability of a resin is fine at a laminate-molding time and no voids occur so that moldability is fine.

The phenylene ether oligomer cyanate compound of the formula (10) having a cyanate group at each terminal (to be referred to as "bifunctional PEO-2CN" hereinafter), provided by the present invention 6, will be explained.

The above bifunctional PEO-2CN is obtained by reacting the bifunctional PEO of the formula (1) with cyanogen halide such as cyanogen chloride or cyanogen bromide in the presence of a base in dehydrohalogenation.

Typical examples of the base include tertiary amines such as trimethylamine, triethylamine, tripropylamine, dimethylaniline and pyridine, sodium hydroxide, potassium hydroxide, sodium methoxide, sodium ethoxide, calcium hydroxide, sodium carbonate, potassium carbonate and sodium bicarbonate. The base shall not be limited to these.

Typical examples of a solvent for the reaction includes toluene, xylene, chloroform, methylene chloride, carbon tetrachloride, chlorobenzene, nitrobenzene, nitromethane, acetone, methyl ethyl ketone, tetrahydrofuran and dioxane. The solvent shall not be limited to these.

When cyanogen chloride is used, the reaction temperature is preferably between −30° C. and +13° C. (boiling point). When cyanogen bromide is used, it is preferably between −30° C. and +65° C.

The number average molecular weight of the thus-obtained bifunctional PEO-2CN is limited in the range of from 700 to 3,000. The above bifunctional PEO-2CN has a low melt viscosity so that its flowability is high. It is excellent in compatibility with a different resin. Further, since it has cyanate groups at both terminals, the resin composition containing it has good adhesive properties. As a result thereof, when the resin composition is exposed to a high temperature at soldering or the like after moisture absorption, the occurrence of swellings can be prevented. Further, since a polyphenylene ether resin is a material having low dielectric characteristics, there can be provided a laminate having low dielectric characteristics.

In the resin composition for laminates, provided by the present invention 6, the content of the bifunctional PEO-2CN is preferably in the range of from 1 to 60% by weight, more preferably 5 to 50% by weight, based on the total amount of the bifunctional PEO-2CN, the epoxy resin, and the different cyanate resin. When the above content is lower than 1% by weight, sufficient flexibility is not obtained. When the above content is higher than 60% by weight, the melt viscosity increases so that voids occur at a laminate-molding, which decreases moldability.

Examples of the cyanate resin, which is an ingredient of the resin composition of the present invention 6, include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, 4,4'-dicyanato-3,3',5,5'-tetramethylbiphenyl, 4,4'-dicyanato-2,2',3,3',5,5'-hexamethylbiphenyl, and cyanates obtained by a reaction of novolak with cyanogen halide.

As an epoxy resin which is an ingredient of the resin composition of the present invention 6, there may be used those epoxy resins which have been disclosed in the present invention 3.

The resin composition for laminates, provided by the present invention 6, may be used in combination with various resins according to a purpose and use. Specific examples of the resins include oxetane resins, acrylates, methacrylates esters; polyallyl compounds such as diallyl benzene and diallyl terephthalate; vinyl compounds such as N-vinyl-2-pyrolidone and divinyl benzene; polymerizable double-bond-containing monomers such as unsaturated polyester; polyfunctional maleimides; polyimides; rubbers such as polybutadiene, thermoplastic resins such as polyethylene, polystyrene and ABS; and engineering plastics such as PPE and polycarbonate. The above resins shall not be limited to these resins.

Further, the resin composition may contain various additives such as a known inorganic or organic filler, a dye, a pigment, a thickener, a lubricant, an antifoamer, a coupling agent, a photosensitizer, an ultraviolet absorber and a flame retardant, as required.

Although the composition of the present invention 6 undergoes curing itself under heat, a heat-curing catalyst can be incorporated in the composition for increasing the curing rate and improving workability and economic efficiency. There may be used a generally known heat-curing catalyst as a heat-curing catalyst for the resin to be used in combination.

A copper-clad laminate using the resin composition for laminates, provided by the present invention 6, is particularly suitably used for a printed wiring board which is required to have low dielectric characteristic. The copper-clad laminate of the present invention 6 is produced by a generally known method. That is, it is a method in which a base material is impregnated with a resin varnish which is a solution of a thermosetting resin composition in an organic solvent, the base material is heat-treated to obtain prepreg, and then the prepreg and a copper foil are laminated and molded under heat to obtain a copper-clad laminate. However, the production method of the copper-clad laminate shall not be limited to this method.

As for the organic solvent used for the copper-clad laminate, the base material to be impregnated with the resin varnish, the heat-treatment conditions, etc., in the present invention 6, there may be employed those materials and conditions which have been disclosed in the present invention 4.

The present invention 7 provides a (meth)acrylate compound represented by the formula (11), pound of the present invention with a photopolymerization initiator. The thus-obtained photosensitive resin composition is suitable for various uses for a resin for a resist, a resin for a buildup wiring board, a sealing resin for liquid-crystal display panel, a color filter material for liquid-crystal display panel, a UV coating composition, various coating materials, an adhesive and the like.

Preferably, in the formula (11), R2, R3, R4, R8 and R9 are an alkyl group having 3 or less carbon atoms, R5, R6 and R7 are a hydrogen atom or an alkyl group having 3 or less carbon atoms, R10 and R11 are an alkyl group having 3 or less carbon atoms, and R12 and R13 are an hydrogen atom or an alkyl group having 3 or less carbon atoms. More preferably, R2, R3, R4, R8 and R9 are a methyl group, R5, R6 and R7 are a hydrogen atom or a methyl group, R10 and R11 are a methyl group, and R12 and R13 are an hydrogen atom or a methyl group. An organic group (which may contain an oxygen atom) having no OH group in a side chain and having one or more carbon atoms can be located at Z'. Examples of -(Z'-O—)— include —(($CH_2$)$_m$—O)—, —($CH_2$CHRO)$_n$— and —($CH_2$—Ar—O)—, while it shall not be limited to these. The method of addition includes a method in which the organic groups are directly added to an intermediate represented by the formula (1) and a method using a halide, while it shall not limited to these methods.

The method of producing the (meth)acrylate compound of the formula (11), provided by the present invention, is not specially limited. The (meth)acrylate compound of the formula (11) may be produced by any methods. For example, the (meth)acrylate compound of the formula (11) is obtained by reacting a compound of the formula (12) with a (meth)acrylic acid or a (meth)acrylic acid derivative. Concretely, The (meth)acrylate compound of the formula (11) is obtained by reacting a compound of the formula (12) with (meth)acrylic

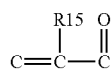—C—$(-$O—Z'$-)_c$$(-$O—Y$-)_a$$(-$O—X—O$-)$$(-$Y—O$-)_b$$(-$Z'—O$-)_d$—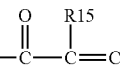=C (11)

wherein R15 is a hydrogen atom or a methyl group, X—, Y—O—, a and b are as defined in the formula (1), Z' is an organic group which have no OH group in a side chain, has one or more carbon atoms and may contain an oxygen atom, and c and d are as defined in the formula (4).

According to the present invention 7, further, there is provided a (meth)acrylate compound according to the above, wherein, in the (meth)acrylate compound of the formula (11), —X— is represented by the formula (5) and Y—O— has a arrangement structure of the formula (6) or the formula (7) or a random arrangement structure of the formula (6) and the formula (7).

According to the present invention 7, further, there is provided a (meth)acrylate compound according to the above, wherein Y—O— has a structure of the formula (7).

According to the present invention 7, further, there is provided a curable resin composition containing the above (meth)acrylate compound.

The (meth)acrylate compound of the present invention itself is polymerized or it is copolymerized with a different unsaturated compound, whereby there is obtained a high molecular weight material excellent in heat resistance and dielectric characteristics. Further, a photosensitive resin composition is obtained by combining the (meth)acrylate comacid in the presence of an esterification catalyst such as p-toluenesulfonic acid, trifluoromethane sulfonic acid or sulfuric acid or its acid halide in the presence of, for example, an organic amine, sodium hydroxide or sodium carbonate, in the presence of a solvent such as, preferably, toluene, xylene, cyclohexane, n-hexane, n-heptane or a mixture of these at a temperature of preferably from 70° C. to 150° C.

The compound of the formula (12) is obtained by producing the compound of the formula (1) by, for example, the method disclosed in Japanese Patent Application No. 2001-196569 and then introducing -(Z'-O)— into it as required.

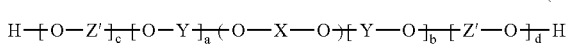

wherein —X—, Y—O—, a and b are as defined in the formula (1), Z' is an organic group which has no OH group in a side chain and has one or more carbon atoms and which may contain an oxygen atom, and c and d are as defined in the formula (4).

A case in which, for example, —($CH_2$)$_m$O— or —($CH_2$CHR$_{14}$O)$_n$— is introduced as -(Z'-O)—, will be explained. —$(CH_2)_mO$— is introduced by reacting a compound of the formula (1) with a halogenated alcohol represented by the formula (13) in a proper solvent such as an alcohol, ether or a ketone in the presence of an alkaline catalyst such as KOH, $K_2CO_3$ or NaOEt, and —$(CH_2CHR_{14}O)_n$— is introduced by reacting a compound of the formula (1) with alkylene oxide represented by the formula (14) in a benzene solvent such as benzene, toluene or xylene in the presence of an alkaline catalyst such as KOH, NaOEt or triethylamine according to, for example, a method disclosed in JP-B-52-4547,

wherein X is Cl or Br, and m is an integer of 2 or more,

wherein R16 is a hydrogen atom, a methyl group or an ethyl group.

Next, the curable resin composition of the present invention 7 will be explained. The curable resin composition is characterized in that it contains the above (meth)acrylate compound of the present invention. The curable resin composition of the present invention may contain a known epoxy resin, an oxetane resin, a compound having an ethylenic unsaturated group, a photpolymerization initiator and/or a thermal polymerization initiator, and a photosensitizer.

As the above epoxy resin, the oxetane resin and the compound having an ethylenic unsaturated group, there may be used those resins and compounds which have been disclosed in the present invention 3.

When the epoxy resin and/or the oxetane resin are used for the curable resin composition of the present invention, an epoxy resin curing agent and/or an oxetane resin curing agent may be used. As these curing agents, there may be used those curing agents which have been disclosed in the present invention 3.

As for the photopolymerization initiator, the photosensitizer and the thermal polymerization initiator, there may be used those materials which have been disclosed in the present invention 3.

Further, in the production of the curable resin composition of the present invention 7, there may be added known additives, as required, such as an inorganic filler, a color pigment, an antifoamer, a surface conditioner, a flame retardant, an ultraviolet absorber, an antioxidant, a polymerization inhibitor and a flow regulator, which are disclosed in the production of the curable resin composition of the present invention 3. The thus-obtained curable resin composition is suitable for various uses for a solder resist composition, a buildup wiring board material, an insulating coating, an adhesive, a printing ink and a coating material.

Effect of the Invention

According to the present invention, there is provided a bifunctional phenylene ether oligomer which is sufficiently soluble in a ketone solvent and has high compatibility with a thermosetting resin and, for example, from which a varnish for laminates is easily prepared and a laminate excellent in molding processability is produced. According to the present invention, there is provided an oligomer of which the terminal phenolic hydroxyl groups are easily modified in a ketone solvent. The oligomer of the present invention has as a basic structure a polyphenylene ether having low dielectric characteristics and strength, which is one of engineer plastics, so that the oligomer is an electric and electronic material having characteristic properties similar to those of a PPE polymer.

According to the present invention, there is provided a thermosetting type phenylene ether oligomer compound which is soluble in a general-purpose solvent and has high compatibility with a different thermosetting resin. Therefore, for example, a varnish for laminates can be easily prepared from the thermosetting type phenylene ether oligomer compound of the present invention and a laminate material excellent in molding processability can be produced.

According to the present invention, there is provided an epoxy acrylate compound having high glass transition temperature and having a low dielectric constant and a low dielectric loss tangent. Due to these characteristic properties, the epoxy acrylate compound of the present invention is remarkably useful as a high-function high molecular weight material and is widely suitable, as a thermally and electrically excellent material, for uses for various coating agents, UV coating compositions, adhesives, resists and laminates.

According to the present invention, there is provided a resin composition containing a phenylene ether oligomer epoxy compound, which resin composition has high heat resistance and excellent electric characteristics such as low dielectric constant and low dielectric loss tangent, is excellent in moldability and is well balanced. A laminate or a multilayer printed wiring board using the resin composition of the present invention is finely molded at a multilayer molding time and has high reliability. Further, the high speed processing of a high-frequency wave signal and a circuit design for low loss are possible.

According to the present invention, there is provided a sealing epoxy resin composition containing a bifunctional PEO-2Ep, which is capable of giving a sealing layer which is free from the occurrence of cracks, when exposed to a high temperature at a solder reflow or the like, and has low dielectric constant. Accordingly, there is provided a semiconductor device having high reliability and having a chip circuit excellent in transmittal speed.

According to the present invention, there is provided a well-balanced resin composition containing a phenylene ether oligomer cyanate compound, which resin composition has high heat resistance and low dielectric characteristics and is excellent in moldability and flexibility. A laminate or a multilayer printed wiring board using the resin composition of the present invention is finely molded at a multilayer molding time and has high reliability. Further, the high-speed processing of a high-frequency wave signal and a circuit design for low loss are possible.

According to the present invention, there is provided an acrylate compound which has a high glass transition temperature and has a low dielectric constant and a low dielectric loss tangent and which is therefore remarkably useful as a high-function high molecular weight material and is widely suitable, as a thermally and electrically excellent material, for uses for various coatings, UV coating compositions, adhesives, resists and buildup printed wiring board material.

EXAMPLES

The present invention will be explained concretely with reference to Examples and Comparative Examples, while the present invention shall not be limited to these Examples. A number average molecular weight and a weight average molecular weight were measured according to the gel permeation chromatography (GPC) method. Data processing was carried out according to the GPC curve and molecular weight calibration curve of a sample. The molecular weight calibration curve was obtained by making an approximation of a relation between the molecular weight of a standard polystylene and the dissolution time thereof with the following equation, $$\text{Log } M = A_0 X^3 + A_1 X^2 + A_2 X + A_3 + A_4/X^2$$

wherein M: a molecular weight, X: an elution time −19 minutes, and A: a coefficient.

A hydroxyl group equivalent was determined from an absorption intensity at 3,600 cm$^{-1}$ in an IR analysis (solution cell method) using 2,6-dimethylphenol as a standard reference material.

Example 1

A longitudinally long reactor having a volume of 2 liters and equipped with a stirrer, a thermometer, an air-introducing tube and a baffleplate was charged with 2.7 g (0.012 mol) of CuBr$_2$, 70.7 g (0.55 mol) of di-n-butylamine and 600 g of methyl ethyl ketone. The components were stirred at a reaction temperature of 40° C., and a mixture solution (bivalent phenol:monovalent phenol molar ratio=1:2) obtained by dissolving 55.7 g (0.21 mol) of a bivalent phenol (2,2',3,3',5,5'-hexamethyl-[1,1'-biphenyl]-4,4'-diol)(a) and 50.4 g (0.41 mol) of 2,6-dimethylphenol in 600 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction mixture to terminate the reaction. Then, washing was carried out with 1N hydrochloric acid aqueous solution three times and then washing was carried out with pure water. The thus-obtained solution was concentrated by an evaporator, and then a suction drying was carried out, to obtain 100.3 g of a reaction product. The reaction product had a number average molecular weight of 650, a weight average molecular weight of 810 and a hydroxyl group equivalent of 310 and it was soluble in methyl ethyl ketone. The above resin will be referred to as "(c)" hereinafter.

Example 2

The same longitudinally long reactor as that used in Example 1 was charged with 1.3 g (0.013 mol) of CuCl, 79.5 g (0.62 mol) of di-n-butylamine and 600 g of methyl ethyl ketone. The components were stirred at a reaction temperature of 40° C., and a mixture solution (bivalent phenol:monovalent phenol molar ratio=1:4) obtained by dissolving 41.8 g (0.16 mol) of a bivalent phenol(2,2',3,3',5,5'-hexamethyl-[1,1'-biphenyl]-4,4'-diol)(a) and 75.6 g (0.62 mol) of 2,6-dimethylphenol in 600 g of methyl ethyl ketone was dropwise added to the reactor over 120 minutes while carrying out bubbling with 2 L/min of air. After the completion of the addition, stirring was carried out for 30 minutes while continuing the bubbling with 2 L/min of air. Then, the termination of the reaction, washings, concentration and suction drying were carried out in the same manners as in Example 1, whereby 111.4 g of a reaction product was obtained. The reaction product had a number average molecular weight of 1,110, a weight average molecular weight of 1,450 and a hydroxyl group equivalent of 580 and it was soluble in methyl ethyl ketone. The above resin will be referred to as "(d)" hereinafter.

Example 3

The same longitudinally long reactor as that used in Example 1 was charged with 1.1 g (0.011 mol) of CuCl, 66.3 g (0.51 mol) of di-n-butylamine and 500 g of methyl ethyl ketone. The components were stirred at a reaction temperature of 40° C., and a mixture solution (bivalent phenol:monovalent phenol molar ratio=1:8) obtained by dissolving 20.9 g (0.077 mol) of a bivalent phenol(2,2', 3,3',5,5'-hexamethyl-[1,1'-biphenyl]-4,4'-diol)(a) and 75.6 g (0.62 mol) of 2,6-dimethylphenol in 600 g of methyl ethyl ketone was dropwise added to the reactor over 120 minutes while carrying out bubbling with 2 L/min of air. After the completion of the addition, stirring was carried out for 30 minutes while continuing the bubbling with 2 L/min of air. Then, the termination of the reaction, washings, concentration and suction drying were carried out in the same manners as in Example 1, whereby 91.4 g of a reaction product was obtained. The reaction product had a number average molecular weight of 1,700, a weight average molecular weight of 2,300 and a hydroxyl group equivalent of 820 and it was soluble in methyl ethyl ketone. The above resin will be referred to as "(e)" hereinafter.

Example 4

The same longitudinally long reactor as that used in Example 1 was used. 111.9 g of a reaction product was obtained in the same manner as in Example 2 except that the mixture solution used in Example 2 was replaced with a mixture solution (bivalent phenol:monovalent phenol molar ratio=1:4) obtained by dissolving 41.8 g (0.15 mol) of 2,2',3, 3',5,5'-hexamethyl-[1,1'-biphenyl]-4,4'-diol(a), 56.7 g (0.46 mol) of 2,6-dimethylphenol and 21.1 g (0.16 mol) of 2,3,6,-trimethylphenol in 600 g of methyl ethyl ketone. The reaction product had a number average molecular weight of 1,000, a weight average molecular weight of 1,350 and a hydroxyl group equivalent of 520 and it was soluble in methyl ethyl ketone. The above resin will be referred to as "(f)" hereinafter.

Comparative Example 1

The same longitudinally long reactor as that used in Example 1 was charged with 1.3 g (0.013 mol) of CuCl, 79.5 g (0.62 mol) of di-n-butylamine and 600 g of methyl ethyl ketone. The components were stirred at a reaction temperature of 40° C., and a mixture solution (bivalent phenol:monovalent phenol molar ratio=1:4) obtained by dissolving 37.4 g (0.16 mol) of a bivalent phenol(3,3',5,5'-tetramethyl-[1,1'-biphenyl]-4,4'-diol)(b) and 75.6 g (0.62 mol) of 2,6-dimethylphenol in 520 g of methyl ethyl ketone was dropwise added to the reactor over 120 minutes while carrying out bubbling with 2 L/min of air. After the completion of the addition, stirring was carried out for 30 minutes while continuing the bubbling with 2 L/min of air, to obtain a large amount of precipitate in the reaction solution. A disodium dihydrogen ethylenediamine tetraacetate aqueous solution was added to the reaction solution to terminate the reaction. A solid was recovered by filtration. Then, the obtained solid was washed with methanol three times. An obtained solution was concentrated by an evaporator, and then a suction drying was carried out, to obtain 80.1 g of a reaction product. The reaction product had a number average molecular weight of 5,300, a weight average molecular weight of 9,000 and a hydroxyl group equivalent of 3,800 and it was insoluble in methyl ethyl ketone. The above resin will be referred to as "(g)" hereinafter.

Comparative Example 2

The same longitudinally long reactor as that used in Example 1 was charged with 1.3 g (0.013 mol) of CuCl, 48.7 g (0.62 mol) of pyridine and 600 g of methyl ethyl ketone. The components were stirred at a reaction temperature of 40° C., and a mixture solution (bivalent phenol:monovalent phenol molar ratio=1:4) obtained by dissolving 41.8 g (0.16 mol) of a bivalent phenol(2,2'3,3',5,5'-hexamethyl-[1,1'-biphenyl]-4,4'-diol)(a) and 75.6 g (0.62 mol) of 2,6-dimethylphenol in 520 g of methyl ethyl ketone was dropwise added to the reactor over 120 minutes while carrying out bubbling with 2 L/min of air. Then, stirring, the termination of the reaction, washings, concentration and suction drying were carried out in the same manners as in Example 1, whereby 110.2 g of a reaction product was obtained. The reaction product had a number average molecular weight of 1,100, a weight average molecular weight of 1,820 and a hydroxyl group equivalent of 600. The above resin will be referred to as "(h)" hereinafter.

Table 1 shows the results of Examples and Comparative Examples.

According to Examples 1, 2 and 3, an increase in the molar ratio of the bivalent phenol increased the number average molecular weight and the weight average molecular weight and the bifunctional oligomers having a desired molecular weight distribution could be obtained by changing the molar ratio. According to the results of Example 2 and Comparative Example 1, when the biphenol (3,3',5,5'-tetramethyl-[1,1'-biphenyl]-4,4'-diol) having no substituent at 2-site ($R_4$ in the formula (2)), as a bivalent phenol, was used as a raw material, the oligomer having an average molecular weight of more than 5,000 was generated. A bifunctional phenylene ether soluble in methyl ethyl ketone was not effectively synthesized.

That is, the presence of substituent at 2-site ($R_4$ in the formula (2)) of the bivalent phenol is essential for effectively synthesizing a bifunctional phenylene ether soluble in methyl ethyl ketone. According to the results of Example 2 and Comparative Example 2, when di-n-butylamine was used as an amine, there could be obtained an oligomer having a sharper molecular weight distribution than that of the case where pyridine was used. According to the results of Example 2 and Example 4, when compared with the case where 2,6-dimethylphenol alone was used as a monovalent phenol, the case where the mixture of 2,6-dimethylphenol and 2,3,6-trimethylphenol was used as a monovalent phenol gave an oligomer having a lower molecular weight. The reason is that the methyl group at the 3-site of 2,3,6-trimethylphenol prevented polymerization and prevented the generation of a polymer.

TABLE 1

|  | Ex. 1 | Ex. 2 | Ex. 3 | Ex. 4 | CEx. 1 | CEx. 2 |
|---|---|---|---|---|---|---|
| Resin | c | d | e | f | g | h |
| Bivalent phenol | a | a | a | a | b | a |
| molar ratio *1 | 2 | 4 | 8 | 4 | 4 | 4 |
| Amine *2 | A | A | A | A | A | B |
| Mn | 650 | 1,110 | 1,700 | 1,000 | 5,300 | 1,100 |
| Mw | 810 | 1,450 | 2,300 | 1,350 | 9,000 | 1,820 |
| Mn/Mw | 1.25 | 1.31 | 1.35 | 1.35 | 1.70 | 1.65 |
| Hydroxyl group equivalent | 310 | 580 | 820 | 520 | 3,800 | 600 |
| Solubility *3 | ○ | ○ | ○ | ○ | X | ○ |

Ex. = Example, CEX = Comparative Example
*1 molar ratio: 2,6-dimethylphenol/bivalent phenol
*2 A: di-n-butylamine, B: pyridine
*3 solubility in methyl ethyl ketone Example 5

A reactor equipped with a stirrer, a thermometer and a dropping funnel was cooled down to −10° C. 200 ml of a methylene chloride solution containing cyanogen chloride (0.129 mol) was placed in the reactor. Then, a solution obtained by dissolving 50.0 g (hydroxyl group 0.086 mol) of the phenylene ether oligomer (bifunctional PEO) obtained in Example 2 and 13.1 g (0.129 mol) of triethylamine in 250 g of methyl ethyl ketone, was dropwise added from the dropping funnel over 60 minutes so as to maintain the temperature of the reaction solution at 10° C. or less. After the completion of the addition, stirring was carried out for 60 minutes. Then, washing was carried out with 0.1N hydrochloric acid aqueous solution three times, then washing was carried out with pure water, and further a filtration was carried out, to remove a generated salt and impurities. The methylene chloride and the methyl ethyl ketone were evaporated from the obtained solution, and a suction drying was carried out, to obtain 50.1 g of a cyanate compound. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed. 0.1 part by weight of tin octylate was added to 100 parts by weight of the thus-obtained cyanate compound. The melting, degassing and molding thereof were carried out at 160° C., and curing was carried out at 230° C. for 3 hours, to obtain a cured product. The cured product had a glass transition temperature of 242° C. according to the measurement of dynamic viscoelasticity (DMA). Further, its dielectric constant at 1 GHz was 2.73 and its dielectric loss tangent was 0.0061.

Example 6

111.9 g of a bifunctional PEO was obtained in the same manner as in Example 2. The bifunctional PEO had a number average molecular weight of 1,000, a weight average molecular weight of 1,350 and a hydroxyl group equivalent of 520.

50.8 g of a cyanate compound was obtained in the same manner as in Example 5 except that the methylene chloride solution containing cyanogen chloride (0.129 mol) used in the Example 5 was replaced with a methylene chloride solution containing cyanogen chloride (0.144 mol) and that 13.1 g (0.129 mol) of triethylamine was replaced with 14.6 g (0.144 mol) of triethylamine. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

The thus-obtained cyanate compound was treated similarly to Example 5, to obtain a cured product. The cured product had a glass transition temperature of 251° C. according to the measurement of dynamic viscoelasticity (DMA). Further, its dielectric constant at 1 GHz was 2.70 and its dielectric loss tangent was 0.0053.

Example 7

A reactor equipped with a stirrer, a thermometer and a dropping funnel was charged with 40.0 g (hydroxyl group 0.129 mol) of the bifunctional PEO obtained in Example 1 and 360.0 g of epichlorohydrin. The mixture was heated up to 100° C. Then, a solution obtained by dissolving 10.5 g (0.155 mol) of sodium ethoxide in 250 g of ethanol was dropwise added from the dropping funnel over 60 minutes. After the completion of the addition, stirring was carried out for 5 hours. Then, washing was carried out with 0.1N hydrochloric acid aqueous solution three times, then washing was carried out with pure water, and further a filtration was carried out, to remove a generated salt and impurities. The excess epichlorohydrin was distilled off from the obtained solution, and a suction drying was carried out, to obtain 45.9 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed.

3 parts by weight of 1-benzyl-2-methylimidazole was added to 100 parts by weight of the thus-obtained epoxy compound. The melting, degassing and molding thereof were carried out at 150° C., and curing was carried out at 180° C. for 10 hours, to obtain a cured product. The cured product had a glass transition temperature of 197° C. according to the measurement of dynamic viscoelasticity (DMA). Further, its dielectric constant at 1 GHz was 2.75 and its dielectric loss tangent was 0.0140.

Example 8

Example 3 was repeated till the washing with pure water except that 500 g of methyl ethyl ketone in Example 3 was replaced with 500 g of toluene, and that 600 g of methyl ethyl ketone in Example 3 was replaced with 600 g of methanol.

The obtained solution was concentrated by an evaporator, to obtain a 70% bifunctional PEO toluene solution. Part of the above solution was further concentrated and a suction drying was carried out, to obtain a powder. The bifunctional PEO had a number average molecular weight of 1,620, a weight average molecular weight of 2,180 and a hydroxyl group equivalent of 810.

Production Process of Allyl Compound

A solution obtained by dissolving 71.4 g (hydroxyl group 0.062 mol) of the above 70% bifunctional PEO toluene solution and 14.9 g (0.123 mol) of allyl bromide in 150 g of methylene chloride, and 120 ml of 1N sodium hydroxide aqueous solution were placed in a reactor equipped with a stirrer and a thermometer at room temperature. Further, 2.2 g (0.0062 mol) of benzyltri-n-butylammonium bromide as a phase transfer catalyst was added to the reactor. The mixture was stirred for 5 hours. Then, washing was carried out with 0.1N hydrochloric acid aqueous solution three times, then washing was carried out with pure water, and further a filtration was carried out, to remove a generated salt and impurities. The methylene chloride was distilled off from the obtained solution, and a suction drying was carried out, to obtain 51.5 g of an allyl compound. According to the IR analysis of the obtained allyl compound, the absorption peak (3,600 cm−1) of a phenolic hydroxyl group disappeared, and according to the NMR analysis, a peak derived from the allyl group appeared so that it was confirmed that all functional groups were changed.

The melting, degassing and molding of the allyl compound were carried out at 150° C., and curing was carried out at 230° C. for 3 hours, to obtain a cured product. The cured product had a glass transition temperature of 216° C. according to the measurement of dynamic viscoelasticity (DMA). Further, its dielectric constant at 1 GHz was 2.67 and its dielectric loss tangent was 0.0035.

Comparative Example 3

3 parts by weight of 1-benzyl-2-methylimidazole was added to 100 parts by weight of 3,3',5,5'-tetramethyl-[1,1'-biphenyl]-4,4'-glycidyl ether which was a biphenyl type epoxy resin for a semiconductor-sealing material. The mixture was molten, degassed and molded at 150° C. and then cured at 180° C. for 10 hours, to obtain a cured product. The cured product had a glass transition temperature of 133° C. according to the measurement of dynamic viscoelasticity (DMA). Further, its dielectric constant at 1 GHz was 3.06 and its dielectric loss tangent was 0.030.

Comparative Example 4

3 parts by weight of 1-benzyl-2-methylimidazole was added to 100 parts by weight of dicyclopentadiene type epoxy for a semiconductor-sealing material. The mixture was molten, degassed and molded at 150° C. and then cured at 180° C. for 10 hours, to obtain a cured product. The cured product had a glass transition temperature of 182° C. according to the measurement of dynamic viscoelasticity (DMA). Further, its dielectric constant at 1 GHz was 2.90 and its dielectric loss tangent was 0.020.

The dielectric constant and the dielectric loss tangent were obtained according to a cavity resonant oscillation method.

Table 2 shows the above results.

TABLE 2

|  | Ex. 5 | Ex. 6 | Ex. 7 | Ex. 8 | CEx. 3 | CEx. 4 |
|---|---|---|---|---|---|---|
| dielectric constant (1 GHz) | 2.73 | 2.70 | 2.75 | 2.67 | 3.06 | 2.90 |
| dielectric loss tangent (1 GHz) | 0.0061 | 0.0053 | 0.0140 | 0.0035 | 0.030 | 0.020 |
| Tg(DMA)/° C. | 242 | 251 | 197 | 216 | 133 | 182 |

Ex. = Example, CEX = Comparative Example

Example 9

Synthesis of Bifunctional PEO

A longitudinally long reactor having a volume of 2 liters and equipped with a stirrer, a thermometer, an air-introducing tube and a baffleplate was charged with 11.3 g (0.012 mol) of CuCl, 70.7 g (0.55 mol) of di-n-butylamine and 400 g of methyl ethyl ketone. The components were stirred at a reaction temperature of 40° C., and a solution obtained by dissolving 43.2 g (0.16 mol) of a bivalent phenol 2,2',3,3',5,5'-hexamethyl-[1,1'-biphenyl]-4,4'-diol and 58.6 g (0.48 mol) of 2,6-dimethylphenol in 800 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction solution to terminate the reaction. Then, washing was carried out with 1N hydrochloric acid aqueous solution three times and then washing was carried out with pure water. The thus-obtained solution was concentrated by an evaporator, and a suction drying was carried out, to obtain 96.7 g of a bifunctional PEO. The oligomer had a number average molecular weight of 810, a weight average molecular weight of 1,105 and a hydroxyl group equivalent of 475.

Synthesis of Epoxy Compound

A reactor equipped with a stirrer, a thermometer and a dropping funnel was charged with 50 g (hydroxyl group 0.11 mol) of the above oligomer and 292 g of epichlorohydrin. The mixture was heated up to 100° C. Then, a solution obtained by dissolving 8.6 g (0.13 mol) of sodium ethoxide in 30 g of ethanol was dropwise added from the dropping funnel over 60 minutes. After the completion of the addition, stirring was carried out for 5 hours. Then, washing was carried out with 0.1N hydrochloric acid aqueous solution three times, then washing was carried out with pure water, and further a filtration was carried out, to remove a generated salt and impurities. The excess epichlorohydrin was distilled off from the obtained solution, and a suction drying was carried out, to obtain 53.2 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed. The resin had a number average molecular weight of 965, a weight average molecular weight of 1,213 and an epoxy equivalent of 543.

Synthesis of Epoxy Acrylate Compound

A reactor equipped with a stirrer, a thermometer and a reflux tube was charged with 25 g of the above epoxy compound, 3.3 g of an acrylic acid, 20 g of carbitol acetate, 0.13 g of triphenylphosphine and 13 mg of hydroquinone methyl ether. The mixture was heated up to 120° C., and it was allowed to react with stirring. During the reaction, an acid value was measured, and the reaction was continued until the acid value became 2 mgKOH/g. The stirring time at 120° C. was 5 hours. The reaction solution was diluted with 40 g of methyl ethyl ketone. The diluted reaction solution was dropwise added to methanol to obtain a precipitate again. A solid was recovered by a filtration, and then a suction drying was carried out to obtain 25.2 g of an epoxyacrylate compound. The epoxyacrylate compound had a number average molecular weight of 1,375 and a weight average molecular weight of 1,656.

Example 10

10 g of the epoxy acrylate compound obtained in Example 9 was molten, degassed and molded at 150° C. and then cured at 200° C. for 6 hours to obtain a cured product.

Example 11

6 g of the epoxy acrylate compound obtained in Example 9 was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface with a screen printing machine, and then dried with an air dryer at 80° C. for 30 minutes. A pattern film was placed on the coating, and the coating was exposed at 2,000 mJ with a UV irradiation device (supplied by EYE GRAPHICS Co. Ltd.: UB0151, light source: metal halide lamp). After the exposure, development was carried out with methyl ethyl ketone. In this case, only non-exposed portions were dissolved in methyl ethyl ketone, to obtain a development pattern of the resin-cured product. A pencil mar strength (JIS K5400) of the resin-cured product was HB.

Example 12

Synthesis of Acid-modified Epoxy Acrylate Compound

A reactor equipped with a stirrer, a thermometer and a reflux tube was charged with 10 g of the epoxy acrylate compound obtained in Example 9, 7 g of carbitol acetate and 2.5 g of tetrahydrophthalic acid anhydride. The mixture was heated up to 80° C., and it was allowed to react with stirring. After 8 hours, according to IR measurement, a peak derived from the acid anhydride disappeared, and therefore the reaction was terminated to obtain an acid-modified epoxy acrylate compound. The acid value of the acid-modified epoxy acrylate compound was 81 mgKOH/g. The acid-modified epoxy acrylate compound had a number average molecular weight of 1,769 and a weight average molecular weight of 2,111.

Example 13

1 g of Darocur 1173 (supplied by Ciba Specialty Chemicals, photopolymerization initiator) was added to 10 g of the acid-modified epoxy acrylate compound obtained in Example 12 to obtain a resin composition. The resin composition was applied to a copper-clad laminate surface with a screen printing machine, and then dried with an air dryer at 80° C. for 30 minutes. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with 1% sodium hydroxide aqueous solution. In this case, only non-exposed portions were dissolved in the sodium hydroxide aqueous solution, to obtain a development pattern of the resin-cured product. A pencil mar strength (JIS K5400) of the resin-cured product was HB.

Comparative Example 5

38 g of tetramethylbisphenoldiglycidyl ether (YX4000: supplied by Japan Epoxy Resins Co., Ltd: epoxy equivalent 190) and 14.4 g of acrylic acid were dissolved at 60° C. Then, 0.19 g of triphenylphosphine and 19 mg of hydroquinone methyl ether were added to the mixture. The resultant mixture was heated up to 100° C., and the mixture was stirred for 10 hours. During the reaction, an acid value was measured. After the acid value became 2 mgKOH/g, the mixture was cooled down to 60° C. to obtain a resin. The resin was a viscous liquid at 60° C.

Comparative Example 6

10 g of the resin obtained in Comparative Example 5 was molten, degassed and molded at 120° C. and then cured at 200° C. for 6 hours to obtain a cured product.

Comparative Example 7

10 g of bisphenol A type epoxy acrylate (SP1509, supplied by SHOWA HIGHPOLYMER CO., LTD) was degassed and molded at 120° C. and then cured at 200° C. for 6 hours to obtain a cured product.

Comparative Example 8

10 g of novolak type epoxy acrylate (SP4010, supplied by SHOWA HIGHPOLYMER CO., LTD) was degassed and molded at 120° C. and then cured at 200° C. for 6 hours to obtain a cured product.

The cured products obtained in Example 10 and comparative Example 6, 7 and 8 were evaluated for properties by the following methods.

Glass transition temperature (Tg): Obtained by dynamic viscoelasticity measurement (DMA). Measurements were carried out at an oscillation frequency of 10 Hz.

Dielectric constant and dielectric loss tangent: Obtained according to a cavity resonant oscillation method.

Table 3 shows the evaluation results of the above properties.

TABLE 3

|  | Ex. 10 | CEx. 6 | CEx. 7 | CEx. 8 |
|---|---|---|---|---|
| Tg(° C.) | 198 | 165 | 140 | 142 |
| dielectric constant (1 GHz) | 2.74 | 3.12 | 3.31 | 3.10 |
| dielectric loss tangent (1 GHz) | 0.018 | 0.036 | 0.052 | 0.032 |

Ex. = Example, CEX = Comparative Example

Example 14

Production Process of Bifunctional PEO-2Ep

A reactor equipped with a stirrer, a thermometer and a dropping funnel was charged with 40.0 g (hydroxyl group 0.077 mol) of the bifunctional PEO obtained in Example 4 and 213.5 g of epichlorohydrin. The mixture was heated up to 100° C. Then, a solution obtained by dissolving 6.3 g (0.092 mol) of sodium ethoxide in 22.0 g of ethanol was dropwise added from the dropping funnel over 60 minutes. After the completion of the addition, further, stirring was carried out for 5 hours. Then, washing was carried out with 0.1N hydrochloric acid aqueous solution three times, then washing was carried out with pure water, and further a filtration was carried out, to remove a generated salt and impurities. The excess epichlorohydrin was distilled off from the obtained solution, and a suction drying was carried out, to obtain 43.1 g of a bifunctional PEO-2Ep (number average molecular weight: 1,150). According to the IR analysis of the obtained bifunctional PEO-2Ep [A], the absorption peak (3,600 cm−1) of a phenolic hydroxyl group disappeared, and according to the NMR analysis, a peak derived from glycidyl ether appeared so that it was confirmed that all functional groups were changed.

70 parts by weight of the above bifunctional PEO-2Ep, 20 parts by weight of tetrabromobisphenol A epoxy (supplied by Dainippon Ink And Chemicals, Incorporated, trade name: EPICLON-153), 10 parts by weight of 4,4'-diaminodiphenylmethane and 0.07 part by weight of 2-methylimidazole were dissolved in methyl ethyl ketone, to prepare a varnish having a resin content of 60% by weight. A glass cloth (NE glass product: trade name WEX983, supplied by Nitto Boseki Co., Ltd.) was impregnated with the above varnish, and then it was treated with a hot-air dryer, to obtain B-stage prepreg. Eight sheets of the prepreg and a copper foil (thickness: 18 μm, supplied by Mitsui Mining & smelting Co., Ltd., trade name: 3EC-3) were stacked and these materials were hot-pressed at 200° C. in vacuum for 2 hours to obtain a 0.8 mm-thick copper-clad laminate. Table 5 shows the physical properties of the copper-clad laminate.

Example 15 and Comparative Examples 9 to 11

Copper-clad laminates were obtained in the same manner as in Example 14 except that thermosetting resins were mixed in amount ratios shown in Table 4. As an exception, in Comparative Example 10, toluene was used as a solvent, since an ingredient was insoluble in methyl ethyl ketone.

TABLE 4

|  | Ex. 14 | Ex. 15 | CEx. 9 | CEx. 10 | CEx. 11 |
|---|---|---|---|---|---|
| Bifunctional PEO-2Ep | 70 | 50 | — | — | — |
| General-purpose PPE polymer | — | — | — | 30 | — |
| Bisphenol A type cyanate prepolymer | — | 30 | — | 30 | 30 |
| 4,4' dimethyl diphenylmethane | 10 | — | 18 | — | — |
| Tetrabromobisphenol A epoxy | 20 | 20 | 20 | 20 | 20 |
| Bisphenol A epoxy | — | — | 10 | 20 | — |
| Phenol novolak type epoxy | — | — | 52 | — | 50 |
| iron acetylacetonate | — | 0.04 | — | 0.04 | 0.04 |
| 2-methylimidazole | 0.07 | — | 0.07 | — | — |

Ex. = Example, CEx. = Comparative Example

General-purpose PPE polymer: supplied by Mitsubishi Gas Chemical Co., Inc., number average molecular weight: 24,000.

Bisphenol A type cyanate prepolymer: prepolymer of 2,2-bis(4-cyanatophenyl)propane.

Tetrabromobisphenol A epoxy: EPICLON-153, supplied by Dainippon Ink And Chemicals, Incorporated.

Bisphenol A epoxy: DER-331L, supplied by Dow Chemical Japan Ltd.

Phenol novolak type epoxy: EPPN-201, supplied by Nippon Kayaku Co., Ltd.

TABLE 5

|  | Ex. 14 | Ex. 15 | CEx. 9 | CEx. 10 | CEx. 11 |
|---|---|---|---|---|---|
| Grass transition temperature (DMA method) | 191° C. | 217° C. | 156° C. | 202° C. | 190° C. |
| Dielectric constant (1 GHz) | 3.4 | 3.5 | 4.2 | 3.5 | 4.0 |
| Dielectric loss tangent (1 GHz) | 0.0078 | 0.0018 | 0.021 | 0.0046 | 0.014 |
| Copper-foil peeling strength (kN/m) | 1.1 | 1 | 1.2 | 1.4 | 1.2 | 0.9 |
| Moldability | ○ | ○ | ○ | X | ○ |
| Heat resistance against soldering after moisture absorption (number of swelling/number of tested specimens) | | | | | |
| 1 hour treatment | 0/3 | 0/3 | 0/3 | 2/3 | 0/3 |
| 2 hours treatment | 0/3 | 0/3 | 0/3 | 3/3 | 0/3 |
| 3 hours treatment | 0/3 | 0/3 | 2/3 | 3/3 | 1/3 |

Ex. = Example, CEx. = Comparative Example

In Examples and Comparative Examples, measurements were carried out by the following devices and methods.

Grass transition temperature (Tg): Obtained by a loss tangent (tan δ) peak of a dynamic viscoelasticity measurement.

Dielectric constant and dielectric loss tangent: Measured according to a cavity resonant oscillation method.

Copper foil peeling strength: Peeling strength of a copper foil having a width of 10 mm in a 90-degree direction was measured according to JIS C6481.

Heat resistance against soldering after moisture absorption: A sample was prepared by removing the entire copper foil, the sample was treated for absorption under PCT conditions at 121° C. at 0.2 MPa for 1 to 3 hours and then the sample was immersed in a solder bath at 260° C. for 30 seconds. The sample was visually observed for the occurrence of a delamination (swelling).

Moldability: Determined depending upon whether or not an internal layer pattern of a 70 μm-thick copper foil could be embedded without voids.

Referential Example 1

Production Process of Bifunctional PEO-2Ep (1)

Production Process of Bifunctional PEO

A phenylene ether oligomer solution was obtained in the same manner as in Example 3 except that 500 g of methyl ethyl ketone was replaced with 500 g of toluene and that 600 g of methyl ethyl ketone was replaced with 600 g of methanol. The obtained solution was concentrated by an evaporator to obtain a 70% bifunctional PEO toluene solution. Part of the solution was further concentrated, and a suction drying was carried out to obtain a powder. The powder had a number average molecular weight of 1,620, measured by the GPC method, and a hydroxyl group equivalent of 810.

Production Process of Bifunctional PEO-2Ep 41.5 g of a bifunctional PEO-2Ep (number average molecular weight: 1,780, to be referred to as "bifunctional PEO-2Ep [B]" hereinafter) was obtained in the same manner as in Example 14 except that 57.1 g (hydroxyl group: 0.049 mol) of the above-obtained bifunctional PEO toluene solution, 228.5 g of epichlorohydrin, 14.2 g of ethanol and 4.0 g (0.059 mol) of sodium ethoxide were used. According to the IR analysis of the obtained bifunctional PEO-2Ep [B], a peak derived from glycidyl ether appeared so that it was confirmed that all functional groups were changed.

Referential Example 2

Production Process of Bifunctional PEO-2Ep (2)

Production Process of Bifunctional PEO

A 70% bifunctional PEO toluene solution was obtained in the same manner as in Referential Example 1 except that there was used a mixture solution (bivalent phenol:monovalent phenol molar ratio=1:15) obtained by dissolving 11.9 g (0.044 mol) of 2,2',3,3',5,5'-hexamethyl-(1,1'-biphenyl)-4,4'-diol and 79.9 g (0.66 mol) of 2,6-dimethylphenol in 600 g of methanol. Part of the solution was further concentrated, and a suction drying was carried out to obtain a powder. The powder had a number average molecular weight of 3,340 and a hydroxyl group equivalent of 1,660. The number average molecular weight was measured in the same manner as in Referential Example 1.

Process for the Production of Bifunctional PEO-2Ep 49.8 g of a bifunctional PEO-2Ep (number average molecular weight: 3,500, to be referred to as "bifunctional PPE-2Ep [C]" hereinafter) was obtained in the same manner as in Referential Example 1 except that 71.4 g (hydroxyl group: 0.024 mol) of the above-obtained bifunctional PEO toluene solution, 155.7 g of epichlorohydrin, 6.9 g of ethanol and 2.0 g (0.029 mol) of sodium ethoxide were used. According to the same method as that in Referential Example 1, it was confirmed that all functional groups were changed.

Referential Example 3

Production Process of an Epoxy-modified Polyphenylene Ether 47.7 g of an epoxy-modified polyphenylene ether (to be referred to as "epoxy-modified PPE" hereinafter, number average molecular weight: 16,000) was obtained in the same manner as in Referential Example 1 except that 50 g of a commercially available polyphenylene ether resin (supplied by Mitsubishi Gas Chemical Co., Inc., number average molecular weight: 16,000, hydroxyl group: 0.003 mol), 200 g of toluene, 2.9 g of epichlorohydrin, 2.2 g of ethanol and 0.6 g (0.009 mol) of sodium ethoxide were used. According to the same method as that in Referential Example 1, it was confirmed that 95% of functional groups were changed.

Example 16

There were used 32.40 parts by weight (7.02% by weight) of YX400H (supplied by Japan Epoxy Resins Co., Ltd, epoxy equivalent 195) as a biphenyl type epoxy resin, 10.80 parts by weight (2.34% by weight) of 195XL (supplied by Sumitomo Chemical Co., Ltd., epoxy equivalent 195) as a cresol novolak type epoxy resin, 3.78 parts by weight (0.82° by weight) of EBS400T (supplied by Sumitomo Chemical Co., Ltd., epoxy equivalent 400) as a flame-retardant bisphenol type epoxy resin, 11.5 parts by weight (2.49% by weight) of bifunctional PEO-2Ep [B], 15.93 parts by weight (3.45% by weight) of KAYAHARD NHN (supplied by Nippon Kayaku Co., Ltd., hydroxyl group equivalent 140) as a naphthalene type phenol resin composition, 15.93 parts by weight (3.45% by weight) of MILEX 225-3L (supplied by Mitsui Chemicals, Inc., hydroxyl equivalent 173) as a P-xylylene-phenol compolymer, a powder obtained by treating 360.50 parts by weight (78.08% by weight) of a fused silica powder with 2.13 parts by weight (0.46% by weight) of γ-glycidoxypropyltrimethoxysilane, 0.95 part by weight (0.21% by weight) of triphenylphosphine, 1.36 parts by weight (0.30% by weight) of natural carnauba, 0.99 parts by weight (0.21% by weight) of carbon black and 5.40 parts by weight (1.17% by weight) of antimony trioxide. First, the bifunctional PEO-2Ep [B] and the epoxy resins were dissolved in the toluene, to obtain a homogenous toluene solution having a concentration of 30% by weight. The toluene was removed from the above toluene solution, to obtain a mixture of the epoxy resins and the bifunctional PEO-2Ep. The above materials were added to the mixture and the resultant mixture was kneaded with a heating roller at 85° C. for approximately 5 minutes. Then, the kneaded mixture was pulverized so as to have a diameter of approximately 5 mm, whereby a sealing epoxy resin composition was obtained.

Examples 17 to 19 and Comparative Examples 12 to 14

Sealing epoxy resin compositions were obtained in the same manner as in Example 16 except that materials were mixed in amount ratios shown in Table 6. The obtained sealing epoxy resin compositions of Examples 16 to 19 and Comparative Examples 12 to 14 were subjected to a test of heat resistance against soldering, and these resin compositions were evaluated for dielectric constant. Further, the resin compositions were measured for melt viscosity, cured products thereof were measured for bending strength, and the resin compositions were measured for moldability when used for sealing.

The above moldability test and the test of heat resistance against soldering were carried out under the following conditions. A semiconductor chip having 7.6 mm×7.6 mm×0.4 mm(thickness) was mounted on an alloy lead frame having a die pad size of 8.2 mm×8.2 mm with a silver paste, and molding was carried out by using a 60-pin flat package molding die having an outside dimension of 19 mm×15 mm×1.8 mm(thickness) to prepare a test specimen. The obtained test specimen was checked for existence or nonexistence of voids in a sealing layer with an ultrasonic exploratory device. When no voids existed, moldability was good (expressed by ○). When voids existed, moldability was poor (expressed by X). Further, five test specimens were prepared in the above manner. Each of the test specimens was allowed to absorb moisture at 85° C. at 85% RH for 72 hours, then it was immersed in a solder having a temperature of 260° C. for 10 seconds. The procedures of absorption and immersion were carried out two times. After the soldering, the sealing layer was checked for existence or nonexistence of cracks with an ultrasonic exploratory device and the sealing layer having cracks was considered to be defective.

The above dielectric constant was measured on the basis of the measurement method of a molded article according to JIS-K-6911.

The bending strength of a cured product was measured as follows. A sealing epoxy resin composition was cured to prepare a test specimen having a size of 10 mm×4 mm×100 mm, the test specimen was measured for three-point bending strength at room temperature and at 240° C. under conditions of distance between supports=64 mm and a crosshead speed=2 mm/min.

The above melt viscosity of the resin composition was measured at 175° C. with an elevated type flow tester.

Table 7 shows the above results. It was confirmed that moldability was good, no voids occurred, dieletric constant was low, bending strength was high and the melt viscosity was low, when the bifunctional PEO-2Eps having a number average molecular weight of 700 to 3,000 were used.

TABLE 6

|  |  | Ex. 16 | Ex. 17 | Ex. 18 | Ex. 19 | CEx. 12 | CEx. 13 | CEx. 14 |
|---|---|---|---|---|---|---|---|---|
| | | | | | | (Unit: % by weight) | | |
| Epoxy resin | YX4000H | 7.02 | 6.06 | 9.36 | 7.02 | 7.02 | 7.02 | 8.87 |
| | 195XL | 2.34 | | | 2.34 | 2.34 | 2.34 | 2.98 |
| | EBS400T | 0.82 | 0.82 | 0.82 | 0.82 | 0.82 | 0.82 | 0.82 |
| Bifunctional PEO-2Ep [A] | | | | | 2.49 | | | |
| Bifunctional PEO-2Ep [B] | | 2.49 | 5.79 | 2.49 | | | | |
| Bifunctional PEO-2Ep [C] | | | | | | 2.49 | | |
| Epoxy-modified PPE | | | | | | | 2.49 | |
| KAYAHARD NHN | | 3.45 | 3.45 | 3.45 | 3.45 | 3.45 | 3.45 | 3.45 |
| MILEX 225-3L | | 3.45 | 3.45 | 3.45 | 3.45 | 3.45 | 3.45 | 3.45 |
| Fused silica powder | | 78.08 | 78.08 | 78.08 | 78.08 | 78.08 | 78.08 | 78.08 |
| Coupling agent | | 0.46 | 0.46 | 0.46 | 0.46 | 0.46 | 0.46 | 0.46 |
| Triphenyl phosphine | | 0.21 | 0.21 | 0.21 | 0.21 | 0.21 | 0.21 | 0.21 |
| Natural carnauba | | 0.30 | 0.30 | 0.30 | 0.30 | 0.30 | 0.30 | 0.30 |
| Carbon black | | 0.21 | 0.21 | 0.21 | 0.21 | 0.21 | 0.21 | 0.21 |
| antimony trioxide | | 1.17 | 1.17 | 1.17 | 1.17 | 1.17 | 1.17 | 1.17 |

Ex. = Example, CEx. = Comparative Example
Note:

TABLE 6-continued (Unit: % by weight)

|  | Ex. 16 | Ex. 17 | Ex. 18 | Ex. 19 | CEx. 12 | CEx. 13 | CEx. 14 |
|---|---|---|---|---|---|---|---|

As a bifunctional PEO-2Ep [A], the bifunctional PEO-2Ep [A] obtained in Example 14 was used.

TABLE 7

|  |  | Ex. 16 | Ex. 17 | Ex. 18 | Ex. 19 | CEx. 12 | CEx. 13 | CEx. 14 |
|---|---|---|---|---|---|---|---|---|
| Number of the occurrence of cracks after soldering Number of defectives/ Number of specimens tested |  | 0/5 | 0/5 | 0/5 | 0/5 | 2/5 | 5/5 | 5/5 |
| dielectric constant |  | 4.6 | 4.1 | 4.6 | 4.6 | 4.6 | 4.4 | 5.1 |
| Moldability |  | ○ | ○ | ○ | ○ | ○ | X | ○ |
| Bending strength (MPa) | Room temperature | 156 | 160 | 157 | 156 | 147 | 148 | 144 |
|  | 240° C. | 12.7 | 13.7 | 12.7 | 11.7 | 7.8 | 8.8 | 5.9 |
| Melt viscosity (Pa·s) |  | 30 | 34 | 22 | 25 | 37 | 94 | 20 |

Ex. = Example, CEx. = Comparative Example

Example 20

The bifunctional PEO produced in Example 2 was used. The bifunctional PEO was treated in the same manner as in Example 5 to obtain 50.1 g of a cyanate compound (bifunctional PEO-2CN). According to the IR analysis of the obtained cyanate compound, the absorption peak (3,600 cm−1) of a phenolic hydroxyl group disappeared and an absorption peak (2,250 cm−1) derived from a cyanate group appeared so that it was confirmed that all functional groups were changed.

30 parts by weight of the above bifunctional PEO-2CN, 30 parts by weight of bisphenol A type cyanate prepolymer, 20 parts by weight of tetrabromobisphenol A epoxy (supplied by Dainippon Ink And Chemicals, Incorporated, trade name: EPICLON-153), 20 parts by weight of bisphenol A epoxy (supplied by Dow Chemical Japan Ltd., trade name: DER-331L) and 0.04 part of iron acetylacetonate were dissolved in methyl ethyl ketone, to prepare a varnish having a resin content of 60% by weight.

A glass cloth (NE glass product: trade name WEX983, supplied by Nitto Boseki Co., Ltd.) was impregnated with the above varnish, and then it was treated with a hot-air dryer, to obtain B-stage prepreg. Eight sheets of the prepreg and a copper foil (thickness: 18 μm, supplied by Mitsui Mining & smelting Co., Ltd., trade name: 3EC-3) were laminated and these materials were hot-pressed at 200° C. in vacuum for 2 hours to obtain a 0.8 mm-thick copper-clad laminate. Table 9 shows the physical properties of the copper-clad laminate.

Comparative Example 15, 16

Copper-clad laminates were obtained in the same manner as in Example 20 except that thermosetting resins were mixed in amount ratios shown n Table 8. In Comparative Example 15, toluene was used as a solvent, since an ingredient was insoluble in methyl ethyl ketone.

TABLE 8

|  | Ex. 20 | CEx. 15 | CEx. 16 |
|---|---|---|---|
| Bifunctional PEO-2Ep | 30 | — | — |
| General-purpose PPE polymer | — | 30 | — |
| Bisphenol A type cyanate prepolymer | 30 | 30 | 30 |
| 4,4'dimethyl diphenylmethane | — | — | — |
| Tetrabromobisphenol A epoxy | 20 | 20 | 20 |
| Bisphenol A epoxy | 20 | 20 | 10 |
| Phenol novolak type epoxy | — | — | 40 |
| iron acetylacetonate | 0.04 | 0.04 | 0.04 |

Ex. = Example, CEx. = Comparative Example

TABLE 9

|  | Ex. 20 | CEx. 15 | CEx. 16 |
|---|---|---|---|
| Grass transition temperature (DMA method) | 210° C. | 202° C. | 190° C. |
| Dielectric constant (1 GHz) | 3.5 | 3.5 | 4.0 |
| Dielectric loss tangent (1 GHz) | 0.0048 | 0.0046 | 0.014 |
| Copper-foil peeling strength (kN/m) | 1.2 | 1.2 | 0.9 |
| Moldability | ○ | X | ○ |
| Heat resistance against soldering after moisture absorption (number of swelling/number of tested specimens) | | | |
| 1 hour treatment | 0/3 | 2/3 | 0/3 |
| 2 hours treatment | 0/3 | 3/3 | 0/3 |
| 3 hours treatment | 0/3 | 3/3 | 1/3 |
| Bending strength (MPa) | 485 | 368 | 498 |
| bend elastic constant (MPa) | 17800 | 17200 | 19200 |
| Bending flexibility coefficient (%) | 2.9 | 2.4 | 2.8 |

Ex. = Example, CEx. = Comparative Example

Mechanical properties

Head speed: 1.0 mm/min, distance between supports: 20 mm, measured at room temperature.

Example 21

Synthesis of Bifunctional PEO

A longitudinally long reactor having a volume of 5 liters and equipped with a stirrer, a thermometer, an air-introducing tube and a baffleplate was charged with 13.3 g (0.030 mol) of CuCl, 176.8 g (1.34 mol) of di-n-butylamine and 1,000 g of methyl ethyl ketone. The components were stirred at a reaction temperature of 40° C., and a solution obtained by dissolving 108.0 g (0.40 mol) of a bivalent phenol, 2,2',3,3',5,5'-hexamethyl-[1,1'-biphenyl]-4,4'-diol, and 146.5 g (1.20 mol) of 2,6-dimethylphenol in 2,000 g of methyl ethyl ketone was dropwise added to the reactor over 120 minutes while carrying out bubbling with 5 L/min of air. After the completion of the addition, stirring was carried out for 60 minutes while continuing the bubbling with 5 L/min of air. A disodium dihydrogen ethylenediamine tetraacetate aqueous solution was added to the reaction mixture to terminate the reaction. Then, washing was carried out with 1N hydrochloric acid aqueous solution three times and then washing was carried out with pure water. The thus-obtained solution was concentrated by an evaporator and then a suction drying was carried out, to obtain 241.8 g of a bifunctional PEO resin. The resin had a number average molecular weight of 810, a weight average molecular weight of 1,105 and a hydroxyl group equivalent of 475.

(Introduction of Z-Site)

A reactor equipped with a stirrer, a thermometer and a reflux tube was charged with 50 g (hydroxyl group 0.11 mol) of the above bifunctional PEO resin, 14.5 g of potassium carbonate and 400 ml of acetone and the mixture was refluxed under nitrogen for 3 hours. Then, 21.0 g of 6-bromo-1-hexanol was dropwise added to the mixture over 1 hour. After the completion of the addition, the mixture was further refluxed for 30 hours. After neutralization with 1N hydrochloric acid aqueous solution, a large amount of pure water was added to the mixture to obtain a precipitate, and toluene was added to perform extraction. The obtained solution was concentrated by evaporator, and the concentrated solution was dropwise added to methanol to obtain a precipitate again. A solid was recovered by a filtration. Then, a suction drying was carried out to obtain 54.7 g of a bifunctional PEO resin having z-sites introduced thereto. The resin had a number average particle diameter of 1,024 a weight average particle diameter of 1,385 and a hydroxyl group equivalent of 579.

(Synthesis of an Acrylate Compound)

A reactor equipped with a stirrer, a thermometer and a reflux tube was charged with 30 g of the above bifunctional PEO resin having z-sites, 4.5 g of an acrylic acid, 30 g of toluene, 0.12 g of p-toluenesulfonic acid and 0.03 of hydroquinone. The mixture was allowed to react under heat with refluxing. A generation water was quantified and collected with a water quantitative receiver. At the time when 0.8 g of the generation water was collected, the reaction mixture was cooled. The reaction temperature was 110 to 120° C. The reaction mixture was neutralized with 20% NaOH aqueous solution and then washed with 20% NaCl aqueous solution three times. The solvent was evaporated under a reduced pressure, to obtain 29.5 g of an acrylate resin. The acrylate resin had a number average molecular weight of 1,188 and a weight average molecular weight of 1,562.

Example 22

Introduction of Z-Site

An airtight reactor was charged with 50 g of the above bifunctional PEO resin obtained in Example 21, and 20 g of toluene and 1 g of potassium hydroxide as a catalyst were added to the reactor. The inside atmosphere of the reactor was substituted with nitrogen. Then, the mixture was heated with stirring, and at the time when the inside temperature reached 70° C. 5.1 g of ethylene oxide was press-injected to the mixture. The mixture was further heated up to 100° C. and an addition reaction was carried out at 100° C. for 4 hours. Further, the reaction mixture was aged for 1 hour. The reaction product was neutralized with 1N hydrochloric acid aqueous solution and the washed with pure water. The solvent was evaporated under a reduced pressure, to obtain 49.2 g of a resin. The bifunctional PEO resin having Z-sites introduced thereto had a number average particle diameter of 901, a weight average particle diameter of 1,213 and a hydroxyl group equivalent of 524.

(Synthesis of an Acrylate Compound)

A reactor equipped with a stirrer, a thermometer and a reflux tube was charged with 30 g of the above bifunctional PEO resin having z-sites, 4.9 g of an acrylic acid, 30 g of toluene, 0.13 g of p-toluenesulfonic acid and 0.03 of hydroquinone. The mixture was allowed to react under heat with refluxing. A generation water was quantified and collected with a water quantitative receiver. At the time when 0.9 g of the generation water was collected, the reaction mixture was cooled. The reaction temperature was 110 to 120° C. The reaction mixture was neutralized with 20% NaOH aqueous solution, and then washed with 20% NaCl aqueous solution three times. The solvent was evaporated under a reduced pressure, to obtain 29.7 g of an acrylate resin. The acrylate resin had a number average molecular weight of 1,042 and a weight average molecular weight of 1,377.

Example 23

Introduction of Z-Sites 50.5 g of a bifunctional PEO resin having z-sites introduced was obtained in the same manner as in Example 22 except that 20 g of toluene was replaced with 25 g of toluene and 5.1 g of the ethylene oxide was replaced with 6.7 g of propylene oxide. The resin had a number average particle diameter of 941, a weight average particle diameter of 1,255 and a hydroxyl group equivalent of 541.

Synthesis of an Acrylate Compound

The above resin was treated in the same manner as in Example 22, to obtain 29.3 g of an acrylate resin. The acrylate resin had a number average molecular weight of 1,084 and a weight average molecular weight of 1,422.

Example 24

10 g of the acrylate resin obtained in Example 21 was molten, degassed and molded at 150° C. and then cured at 200° C. for 6 hours, to obtain a cured product.

Example 25

10 g of the acrylate resin obtained in Example 22 was molten, degassed and molded at 150° C. and then cured at 200° C. for 6 hours, to obtain a cured product.

Example 26

10 g of the acrylate resin obtained in Example 23 was molten, degassed and molded at 150° C. and then cured at 200° C. for 6 hours, to obtain a cured product.

Example 27

6 g of the acrylate compound obtained in Example 21 was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface by a screen printing machine, and then dried with an air dryer at 80° C. for 60 minutes. A pattern film was placed on the coating, and the coating was exposed at 1,500 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in methyl ethylketone, to obtain a development pattern of the resin-cured product. A pencil mar strength (JIS K5400) of the resin-cured product was B.

Example 28

6 g of the acrylate resin obtained in Example 22 was treated in the same manner as in Example 27, to obtain a development pattern of a resin-cured product in which only non-exposed portions were dissolved in methyl ethyl ketone. A pencil mar strength (JIS K5400) of the resin-cured product was B.

Example 29

6 g of the acrylate resin obtained in Example 23 was treated in the same manner as in Example 27, to obtain a development pattern of a resin-cured product in which only non-exposed portions were dissolved in methyl ethyl ketone. A pencil mar strength (JIS K5400) of the resin-cured product was B.

Comparative Example 17

10 g of bisphenol A ethylene oxide adduct diacrylate (LIGHT-ACRYLATE BP-4EA, supplied by KYOEISHA CHEMICAL Co., LTD.) was degassed and molded at 100° C. and then cured at 200° C. for 6 hours, to obtain a cured product.

The cured products obtained in Examples 24, 25, and 26 and Comparative Example 17 were evaluated for properties.

Table 10 shows the evaluation results of the physical properties.

TABLE 10

| | Ex. 24 | Ex. 25 | Ex. 26 | CEx. 17 |
|---|---|---|---|---|
| Tg(° C.) | 185 | 183 | 186 | 105 |
| dielectric constant (1 GHz) | 2.71 | 2.72 | 2.72 | 3.21 |
| dielectric loss tangent (1 GHz) | 0.0096 | 0.0110 | 0.0102 | 0.0302 |

Ex. = Example, CEX = Comparative Example

What is claimed is:

1. An epoxy acrylate compound represented by the formula (8),

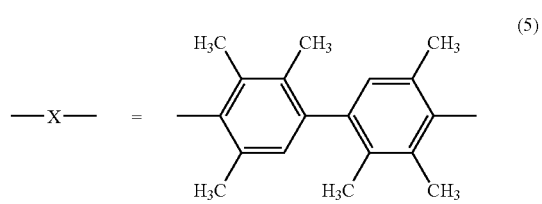

wherein $R_{13}$ is a hydrogen atom or a methyl group,
—X— is represented by the formula (2'),

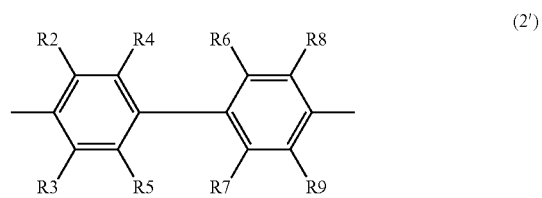

in which R2, R3, R4, R8 and R9 are the same or different and are a halogen atom, an alkyl group having 6 or less carbon atoms or a phenyl group, R5, R6 and R7 are the same or different and are a hydrogen atom, a halogen atom, an alkyl group having 6 or less carbon atoms or a phenyl group, Y—O— is represented by the formula (3'),

in which R10 and R11 are the same or different and are a halogen atom or an alkyl group having 6 or less carbon atoms or a phenyl group, R12 and R13 are the same or different and are a hydrogen atom, a halogen atom, an alkyl group having 6 or less carbon atoms or a phenyl group, Z is an organic group having one or more carbon atoms optionally containing an oxygen atom, and each of c and d is an integer of 0 or 1, provided that Y—O— is an arrangement of one kind of structure defined by the formula (3') or a random arrangement of at least two kinds of structures defined by the formula (3'), and each of a and b is an integer of 0 to 300, provided that at least either a or b is not 0, R2, R3, R4, R8, R9, R10 and R11 in the formula (2') and the formula (3') being required not to be a hydrogen atom and n is an integer of 0 to 10.

2. An epoxy acrylate compound according to claim 1, wherein —X— is represented by the formula (5):

and Y—O— has an arrangement structure of the formula (6):
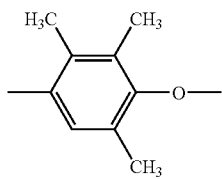
(6)
or the formula (7):
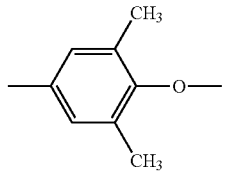
(7)
or a random arrangement structure of the formula (6) and the formula (7).
\* \* \* \* \*